(12) United States Patent
Zheng et al.

(10) Patent No.: US 10,557,907 B2
(45) Date of Patent: Feb. 11, 2020

(54) SYSTEM AND METHOD FOR REDUCING NYQUIST GHOST ARTIFACT

(71) Applicant: UIH AMERICA, INC., Houston, TX (US)

(72) Inventors: Yuan Zheng, Houston, TX (US); Yu Ding, Houston, TX (US); Weiguo Zhang, Houston, TX (US)

(73) Assignee: UIH AMERICA, INC., Houston, TX (US)

( * ) Notice: Subject to any disclaimer, the term of this patent is extended or adjusted under 35 U.S.C. 154(b) by 216 days.

(21) Appl. No.: 15/705,460

(22) Filed: Sep. 15, 2017

(65) Prior Publication Data

US 2019/0086498 A1    Mar. 21, 2019

(51) Int. Cl.
| | | |
|---|---|---|
| *G01R 33/561* | (2006.01) | |
| *G01R 33/48* | (2006.01) | |
| *G01R 33/56* | (2006.01) | |
| *G01R 33/565* | (2006.01) | |

(52) U.S. Cl.
CPC ..... *G01R 33/5612* (2013.01); *G01R 33/4818* (2013.01); *G01R 33/565* (2013.01); *G01R 33/5608* (2013.01); *G01R 33/5616* (2013.01)

(58) Field of Classification Search
CPC .......... G01R 33/4818; G01R 33/5612
USPC ..................................................... 324/309
See application file for complete search history.

(56) References Cited

U.S. PATENT DOCUMENTS

| | | | |
|---|---|---|---|
| 7,710,115 B2 | 5/2010 | Hargreaves | |
| 8,405,395 B2 | 3/2013 | Setsompop et al. | |
| 8,604,786 B2 | 12/2013 | Stemmer | |
| 8,994,373 B2 | 3/2015 | Stemmer | |
| 2015/0309142 A1 | 10/2015 | Li et al. | |
| 2016/0313431 A1* | 10/2016 | Beck | G01R 33/4818 |
| 2017/0089998 A1 | 3/2017 | Feiweier | |
| 2017/0108567 A1 | 4/2017 | Bhat et al. | |
| 2017/0146630 A1* | 5/2017 | Huang | G01R 33/4818 |

FOREIGN PATENT DOCUMENTS

WO    WO2016171759 A1    10/2016

* cited by examiner

*Primary Examiner* — Reena Aurora
(74) *Attorney, Agent, or Firm* — Metis IP LLC

(57) ABSTRACT

A method and system for reducing Nyquist ghost artifact is provide. The method may include: obtaining a plurality of measured data sets; determining, based on the plurality of measured data sets, in a data space, a plurality of convolution kernels, each convolution kernel relating to all of the plurality of measured data sets; generating, based on the plurality of convolution kernels and the plurality of measured data sets, in the data space, a plurality of synthetic data sets; generating, based on the plurality of synthetic data sets and the plurality of measured data sets, in the data space, a plurality of combined data sets, each combined data set relating to one of the plurality of synthetic data sets and a corresponding measured data set of the plurality of measured data sets; and reconstructing, based on the plurality of combined data sets, an image.

20 Claims, 11 Drawing Sheets

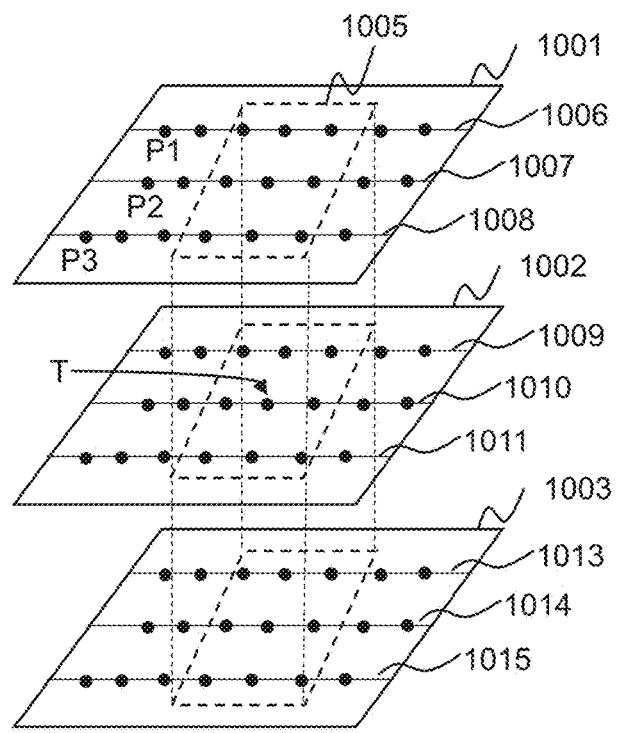
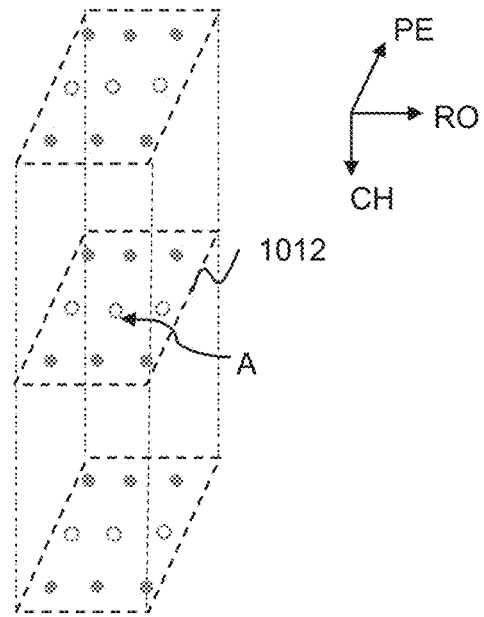
FIG. 10A
FIG. 10B
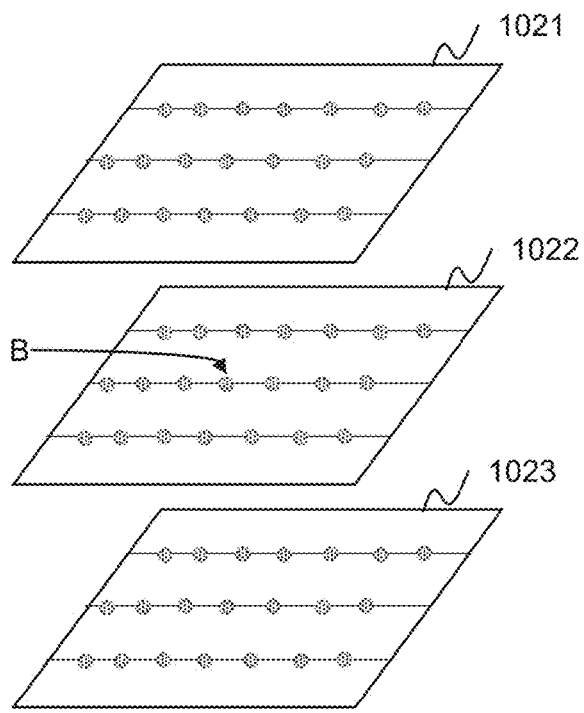
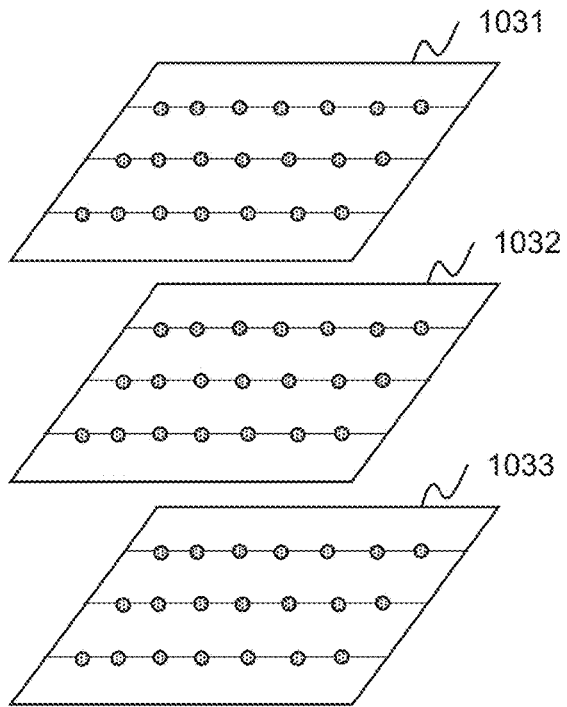
FIG. 10C
FIG. 10D

SYSTEM AND METHOD FOR REDUCING NYQUIST GHOST ARTIFACT

TECHNICAL FIELD

The present disclosure generally relates to image processing, and more specifically relates to a system and method for reducing Nyquist ghost artifact in an image produced by echo planar imaging (EPI).

BACKGROUND

Magnetic resonance imaging (MRI) is widely used. An MRI image may be produced by exploiting a powerful magnetic field and radiofrequency (RF) techniques. During an MRI process, a plurality of acquired RF signals may be filled into k-space. The data in k-space may be transformed to reconstruct an MRI image. Echo planar imaging (EPI) is a fast imaging technique. A whole image may be produced within 30 milliseconds using EPI. The EPI technique may use a reverse direction frequency readout gradient to obtain one or more odd echoes and even echoes in turns. The odd echoes and even echoes in k-space may correspond to a plurality of MR signals acquired with opposite readout gradient polarities, respectively. Due to the eddy current induced by high-speed switching of the gradient magnetic field, phase inconsistencies (or phase errors) may be induced between the odd echoes and even echoes (or between the plurality of MR signals acquired with opposite readout gradient polarities). The existence of phase inconsistencies in k-space data may in turn generate Nyquist ghost artifact in a reconstructed image.

Nyquist ghost artifact may be common in images produced by EPI. One or more traditional techniques may only correct phase errors along a readout (i.e., frequency encoding) direction (also referred to as one-dimensional (1D) phase correction). However, residual artifacts may still exist after such a 1D phase correction. Thus, it is desirable to provide a two-dimensional (2D) phase correction technique to reduce or remove Nyquist ghost artifact.

SUMMARY

In one aspect of the present disclosure, a method implemented on a computing device is provided. The computing device may have at least one processor, at least one computer-readable storage medium, and a communication port connected to an imaging device, the imaging device including a plurality of radiofrequency (RF) coils for receiving a plurality of channels of magnetic resonance (MR) signals. The method may include: a) obtaining a plurality of measured data sets; b) determining, based on the plurality of measured data sets, in a data space, a plurality of convolution kernels, each convolution kernel relating to all of the plurality of measured data sets, each convolution kernel corresponding to a channel of MR signal received by an RF coil; c) generating, based on the plurality of convolution kernels and the plurality of measured data sets, in the data space, a plurality of synthetic data sets, wherein each synthetic data set is generated based on one or more of the plurality of measured data sets and a corresponding convolution kernel of the plurality of convolution kernels, and wherein each synthetic data set and the corresponding convolution kernel correspond to a same channel; d) generating, based on the plurality of synthetic data sets and the plurality of measured data sets, in the data space, a plurality of combined data sets, each combined data set relating to one of the plurality of synthetic data sets and a corresponding measured data set of the plurality of measured data sets; and e) reconstructing, based on the plurality of combined data sets, an image.

In some embodiments, the plurality of measured data sets may be generated by echo planar imaging (EPI) using the imaging device. Each measured data set may correspond to a channel of MR signal received by an RF coil.

In some embodiments, the plurality of measured data sets may be processed by performing a preliminary correction for the plurality of measured data sets.

In some embodiments, the method may further include performing a plurality of iterations. In each current iteration, the method may include designating the plurality of combined data sets generated in a previous iteration as the plurality of measured data sets; repeating b)-d) to update the plurality of combined data sets; and determining whether the plurality of updated combined data sets generated in the current iteration satisfy a termination criterion.

In some embodiments, the termination criterion may relate to a difference between the plurality of combined data sets generated in the previous iteration and the plurality of updated combined data sets generated in the current iteration.

In some embodiments, the generating a plurality of combined data sets may include determining, based on a plurality of weighting factors, a weighted sum of the plurality of synthetic data sets and the plurality of measured data sets to obtain the plurality of combined data sets. Each combined data set may be determined based on a portion of the plurality of weighting factors, one of the plurality of synthetic data sets, and a corresponding measured data set of the plurality of measured data sets.

In some embodiments, each measured data set of the plurality of measured data sets may include a full k-space data set.

In some embodiments, the reconstructing an image may include processing the plurality of combined data sets with an inverse Fourier transform to generate the image.

In some embodiments, at least one measured data set of the plurality of measured data sets may include a partially filled k-space data set.

In some embodiments, the reconstructing an image may include for each measured data set including a partially filled k-space data set, filling, based on at least a portion of the plurality of combined data sets, a corresponding combined data set to reconstruct a full k-space data set; and processing a plurality of full k-space data sets corresponding to the plurality of combined data sets with an inverse Fourier transform to generate the image.

In some embodiments, the data space may be a k-space.

In some embodiments, the data space may be an intermediate space between k-space and an image space. The method may further include determining the intermediate space by processing k-space with a one-dimensional (1D) inverse Fourier transform.

In some embodiments, at least two convolution kernels of the plurality of convolution kernels may be different.

In some embodiments, at least two convolution kernels for a same channel generated in different iterations may be different.

In another aspect of the present disclosure, a magnetic resonance imaging (MRI) method is provided. The method may include generating a plurality of magnetic resonance (MR) signals by scanning a subject using an imaging device. The method may also include receiving the plurality of MR signals using a plurality of radiofrequency (RF) coils of the imaging device. The method may further include obtaining a plurality of measured k-space data sets by entering the MR signals into k-space. Each measured k-space data set may correspond to one of the plurality of RF coils. The method may further include performing one or more corrections for the plurality of measured k-space data sets to obtain a plurality of corrected k-space data sets; and reconstructing, based on the plurality of corrected k-space data sets, an image related to the subject. The one or more corrections may include determining, based on the plurality of measured k-space data sets, a plurality of convolution kernels; generating, based on the plurality of convolution kernels and the plurality of measured k-space data sets, a plurality of synthetic k-space data sets; and generating, based on the plurality of synthetic k-space data sets and the plurality of measured k-space data sets, the plurality of corrected k-space data sets.

In some embodiments, the method may further include before determining the plurality of convolution kernels, performing a linear or non-linear correction for the plurality of measured k-space data sets.

In some embodiments, the determining a plurality of convolution kernels may include processing the plurality of measured k-space data sets with one-dimensional (1D) inverse Fourier transform to obtain an intermediate image; and determining, based on the intermediate image, the plurality of convolution kernels.

In yet another aspect of the preset disclosure, a system is provided. The system may include at least one storage medium storing a set of instructions; at least one processor in communication with the at least one storage medium; and a communication port connected to an imaging device, the imaging device including a plurality of radiofrequency (RF) coils for receiving a plurality of channels of magnetic resonance (MR) signals. When executing the set of instructions, the at least one processor may be configured to cause the system to: a) obtain a plurality of measured data sets; b) determine, based on the plurality of measured data sets, in a data space, a plurality of convolution kernels, each convolution kernel relating to all of the plurality of measured data sets, each convolution kernel corresponding to a channel of MR signal received by an RF coil; c) generate, based on the plurality of convolution kernels and the plurality of measured data sets, in the data space, a plurality of synthetic data sets, wherein each synthetic data set is generated based on one or more of the plurality of measured data sets and a convolution kernel of the plurality of convolution kernels, and wherein each synthetic data set and the convolution kernel correspond to a same channel; d) generate, based on the plurality of synthetic data sets and the plurality of measured data sets, in the data space, a plurality of combined data sets, each combined data set relating to one of the plurality of synthetic data sets and a corresponding measured data set of the plurality of measured data sets; and e) reconstruct, based on the plurality of combined data sets, an image.

In some embodiments, each measured data set of the plurality of measured data sets may include a full k-space data set.

In some embodiments, at least one measured data set of the plurality of measured data sets may include a partially filled k-space data set.

In some embodiments, the data space may be k-space or an intermediate space between k-space and an image space.

In yet another aspect of the present disclosure, a non-transitory computer readable medium is provided. The non-transitory computer readable medium may include executable instructions that, when executed by at least one processor, may cause the at least one processor to effectuate a method including: a) obtaining a plurality of measured data sets; b) determining, based on the plurality of measured data sets, in a data space, a plurality of convolution kernels, each convolution kernel relating to all of the plurality of measured data sets, each convolution kernel corresponding to a channel of MR signal received by an RF coil; c) generating, based on the plurality of convolution kernels and the plurality of measured data sets, in the data space, a plurality of synthetic data sets, wherein each synthetic data set is generated based on one or more of the plurality of measured data sets and a convolution kernel of the plurality of convolution kernels, and wherein each synthetic data set and the convolution kernel correspond to a same channel; d) generating, based on the plurality of synthetic data sets and the plurality of measured data sets, in the data space, a plurality of combined data sets, each combined data set relating to one of the plurality of synthetic data sets and a corresponding measured data set of the plurality of measured data sets; and e) reconstructing, based on the plurality of combined data sets, an image.

In some embodiments, a system is provided. The system may include at least one storage medium storing a set of instructions; and at least one processor in communication with the at least one storage medium. When executing the set of instructions, the at least one processor may be configured to cause the system to generate a plurality of magnetic resonance (MR) signals by scanning a subject using an imaging device. The at least one processor may be further configured to cause the system to receive the plurality of MR signals using a plurality of radiofrequency (RF) coils of the imaging device. The at least one processor may be also configured to cause the system to obtain a plurality of measured k-space data sets by entering the MR signals into k-space, each measured k-space data set corresponding to one of the plurality of RF coils. The at least one processor may be further configured to cause the system to perform one or more corrections for the plurality of measured k-space data sets to obtain a plurality of corrected k-space data sets; and reconstruct, based on the plurality of corrected k-space data sets, an image related to the subject. The one or more corrections may include determining, based on the plurality of measured k-space data sets, a plurality of convolution kernels; generating, based on the plurality of convolution kernels and the plurality of measured k-space data sets, a plurality of synthetic k-space data sets; and generating, based on the plurality of synthetic k-space data sets and the plurality of measured k-space data sets, the plurality of corrected k-space data sets.

In some embodiments, the at least one processor may be further configured to cause the system to before determining the plurality of convolution kernels, perform a linear or non-linear correction for the plurality of measured k-space data sets.

In some embodiments, the determining a plurality of convolution kernels may include processing the plurality of measured k-space data sets with one-dimensional (1D) inverse Fourier transform to obtain an intermediate image; and determining, based on the intermediate image, the plurality of convolution kernels.

In yet another aspect of the present disclosure, a non-transitory computer readable medium is provided. The non-transitory computer readable medium may include executable instructions that, when executed by at least one processor, may cause the at least one processor to effectuate a method including generating a plurality of magnetic resonance (MR) signals by scanning a subject using an imaging device; receiving the plurality of MR signals using a plurality of radiofrequency (RF) coils of the imaging device; obtaining a plurality of measured k-space data sets by entering the MR signals into k-space, each measured k-space data set corresponding to one of the plurality of RF coils; performing one or more corrections for the plurality of measured k-space data sets to obtain a plurality of corrected k-space data sets; and reconstructing, based on the plurality of corrected k-space data sets, an image related to the subject. The one or more corrections may include determining, based on the plurality of measured k-space data sets, a plurality of convolution kernels; generating, based on the plurality of convolution kernels and the plurality of measured k-space data sets, a plurality of synthetic k-space data sets; and generating, based on the plurality of synthetic k-space data sets and the plurality of measured k-space data sets, the plurality of corrected k-space data sets.

In yet another aspect of the present disclosure, a system having at least one processor and a storage configured to store instructions is provided. The system may include a data acquisition module configured to obtain a plurality of measured data sets using an imaging device, the imaging device including a plurality of radiofrequency (RF) coils for receiving a plurality of channels of magnetic resonance (MR) signals. Each measured data set may correspond to a channel of MR signal received by an RF coil. The system may further include a convolution kernel determination unit configured to determine, based on the plurality of measured data sets, in a data space, a plurality of convolution kernels. Each convolution kernel may relate to all of the plurality of measured data sets. Each convolution kernel may correspond to a channel of MR signal received by an RF coil. The system may also include a synthetic data generation unit configured to generate, based on the plurality of convolution kernels and the plurality of measured data sets, in the data space, a plurality of synthetic data sets. Each synthetic data set may be generated based on one or more of the plurality of measured data sets and a convolution kernel of the plurality of convolution kernels. Each synthetic data set and the convolution kernel may correspond to a same channel. The system may further include a combined data generation unit configured to generate, based on the plurality of synthetic data sets and the plurality of measured data sets, in the data space, a plurality of combined data sets. Each combined data set may relate to one of the plurality of synthetic data sets and a corresponding measured data set of the plurality of measured data sets. The system may further include an image reconstruction module configured to reconstruct, based on the plurality of combined data sets, an image.

In some embodiments, each measured data set of the plurality of measured data sets may include a full k-space data set.

In some embodiments, at least one measured data set of the plurality of measured data sets may include a partially filled k-space data set.

In some embodiments, the data space may be k-space or an intermediate space between k-space and an image space.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. The drawings are not to scale. These embodiments are non-limiting exemplary embodiments, in which like reference numerals represent similar structures throughout the several views of the drawings, and wherein:

FIGS. 10A-10D are schematic diagrams illustrating exemplary measured data sets, an exemplary convolution kernel, exemplary synthetic data sets, and exemplary combined data sets according to some embodiments of the present disclosure;

DETAILED DESCRIPTION

In the following detailed description, numerous specific details are set forth by way of examples in order to provide a thorough understanding of the relevant disclosure. However, it should be apparent to those skilled in the art that the present disclosure may be practiced without such details. In other instances, well known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that the term "system," "unit," "module," and/or "block" used herein are one method to distinguish different components, elements, parts, section or assembly of different level in ascending order. However, the terms may be displaced by another expression if they achieve the same purpose.

Figure 2:
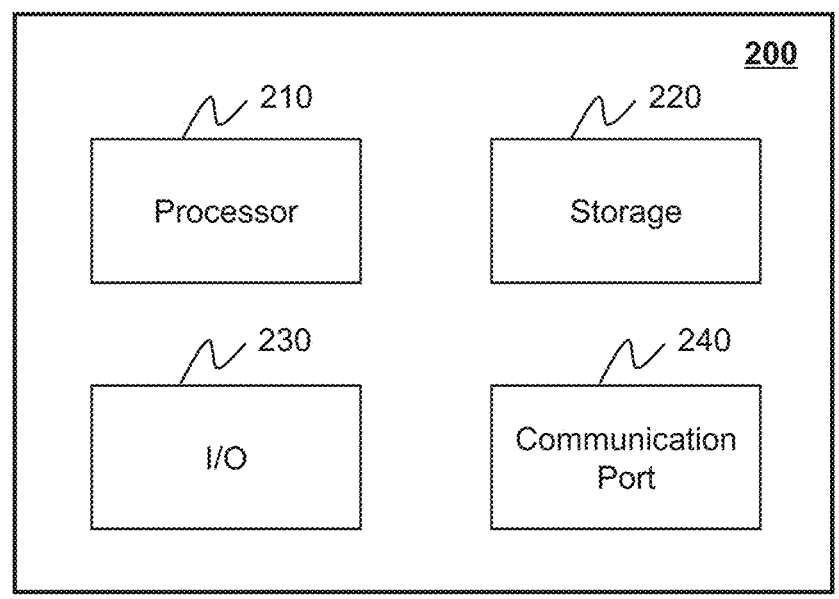
FIG. 2 is a schematic diagram illustrating exemplary hardware and/or software components of an exemplary computing device on which the processing device may be implemented according to some embodiments of the present disclosure.

Generally, the word "module," "unit," or "block," as used herein, refers to logic embodied in hardware or firmware, or to a collection of software instructions. A module, a unit, or a block described herein may be implemented as software and/or hardware and may be stored in any type of non-transitory computer-readable medium or other storage device. In some embodiments, a software module/unit/block may be compiled and linked into an executable program. It will be appreciated that software modules can be callable from other modules/units/blocks or from themselves, and/or may be invoked in response to detected events or interrupts. Software modules/units/blocks configured for execution on computing devices (e.g., processor 210 as illustrated in FIG. 2) may be provided on a computer readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in firmware, such as an EPROM. It will be further appreciated that hardware modules/units/blocks may be included of connected logic components, such as gates and flip-flops, and/or can be included of programmable units, such as programmable gate arrays or processors. The modules/units/blocks or computing device functionality described herein may be implemented as software modules/units/blocks, but may be represented in hardware or firmware. In general, the modules/units/blocks described herein refer to logical modules/units/blocks that may be combined with other modules/units/blocks or divided into sub-modules/sub-units/sub-blocks despite their physical organization or storage.

It will be understood that when a unit, engine, module or block is referred to as being "on," "connected to," or "coupled to," another unit, engine, module, or block, it may be directly on, connected or coupled to, or communicate with the other unit, engine, module, or block, or an intervening unit, engine, module, or block may be present, unless the context clearly indicates otherwise. As used herein, the term "and/or" includes any and all combinations of one or more of the associated listed items.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

The following description is provided with reference to an image processing technique for reducing or removing Nyquist ghost artifact. This is not intended to limit the scope the present disclosure. For persons having ordinary skills in the art, a certain amount of variations, changes, and/or modifications may be deducted under the guidance of the present disclosure. Those variations, changes, and/or modifications do not depart from the scope of the present disclosure.

Figure 1:
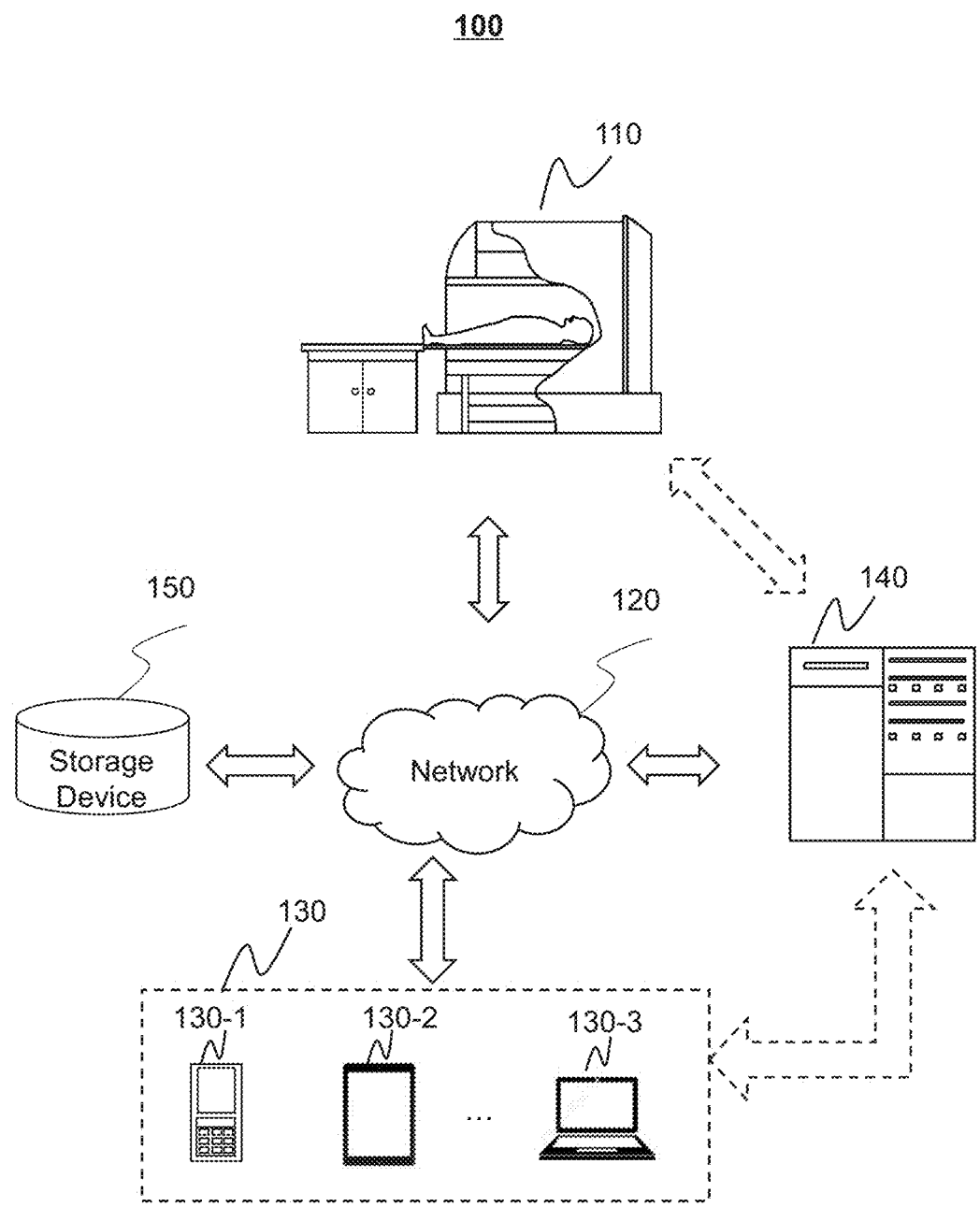
FIG. 1 is a schematic diagram illustrating an exemplary magnetic resonance imaging (MRI) system according to some embodiments of the present disclosure.

FIG. 1 is a schematic diagram illustrating an exemplary magnetic resonance imaging (MRI) system 100 according to some embodiments of the present disclosure. As illustrated, the MRI system 100 may include an MRI scanner 110, a network 120, one or more terminals 130, a processing device 140, and a storage device 150. The components in the MRI system 100 may be connected in one or more of various ways. Merely by way of example, as illustrated in FIG. 1, the MRI scanner 110 may be connected to the processing device 140 through the network 120. As another example, the MRI scanner 110 may be connected to the processing device 140 directly as indicated by the bi-directional arrow in dotted lines linking the MRI scanner and the processing device 140. As a further example, the storage device 150 may be connected to the processing device 140 directly or through the network 120. As still a further example, one or more terminals 130 may be connected to the processing device 140 directly (as indicated by the bi-directional arrow in dotted lines linking the terminal 130 and the processing device 140) or through the network 120.

The MRI scanner 110 may scan a subject located within its detection region and generate a plurality of data relating to the subject. In the present disclosure, "subject" and "object" are used interchangeably. The MRI scanner 110 may include a magnet assembly, a gradient coil assembly, and a radiofrequency (RF) coil assembly (not shown in FIG. 1). In some embodiments, the MRI scanner 110 may be a close-bore scanner or an open-bore scanner.

The magnet assembly may generate a first magnetic field (also referred to as a main magnetic field) for polarizing the subject to be scanned. The magnet assembly may include a permanent magnet, a superconducting electromagnet, a resistive electromagnet, etc. In some embodiments, the magnet assembly may further include shim coils for controlling the homogeneity of the main magnetic field.

The gradient coil assembly may generate a second magnetic field (also referred to as a gradient magnetic field). The gradient coil assembly may be designed for either a close-bore MRI scanner or an open-bore MRI scanner. The gradient coil assembly may include X-gradient coils, Y-gradient coils, and Z-gradient coils. The gradient coil assembly may generate one or more magnetic field gradient pulses to the main magnetic field in the X direction (Gx), Y direction (Gy), and Z direction (Gz) to encode the spatial information of the subject. In some embodiments, the X direction may be designated as a frequency encoding direction, while the Y direction may be designated as a phase encoding direction. In some embodiments, Gx may be used for frequency encoding or signal readout, generally referred to as frequency encoding gradient or readout gradient. In some embodiments, Gy may be used for phase encoding, generally referred to as phase encoding gradient. In some embodiments, Gz may be used for slice selection for obtaining 2D k-space data. In some embodiments, Gz may be used for phase encoding for obtaining 3D k-space data.

The RF coil assembly may include a plurality of RF coils. The RF coils may include one or more RF transmit coils and/or one or more RF receiver coils. The RF transmit coil(s) may transmit RF pulses to the subject. Under the coordinated action of the main magnetic field, the gradient magnetic field, and the RF pulses, MR signals relating to the subject may be generated. The RF receiver coils may receive MR signals from the subject. In some embodiments, one or more RF coils may both transmit RF pulses and receive MR signals at different times. In some embodiments, the function, size, type, geometry, position, amount, and/or magnitude of the RF coil(s) may be determined or changed according to one or more specific conditions. For example, according to the difference in function and size, the RF coil(s) may be classified as volume coils and local coils. In some embodiments, an RF receiver coil may correspond to a channel. The RF receiver coil(s) may receive a plurality of channels of MR signals from the subject. The received MR signal(s) may be sent to the processing device 140 directly or via the network 120 for image reconstruction and/or image processing.

The network 120 may include any suitable network that can facilitate the exchange of information and/or data for the MRI system 100. In some embodiments, one or more components of the MRI system 100 (e.g., the MRI scanner 110, the terminal(s) 130, the processing device 140, or the storage device 150) may communicate information and/or data with one or more other components of the MRI system 100 via the network 120. For example, the processing device 140 may obtain MR signals from the MRI scanner 110 via the network 120. As another example, the processing device 140 may obtain user instructions from the terminal(s) 130 via the network 120. In some embodiments, the network 120 may be any type of wired or wireless network, or a combination thereof. The network 120 may be and/or include a public network (e.g., the Internet), a private network (e.g., a local area network (LAN), a wide area network (WAN)), etc.), a wired network (e.g., an Ethernet network), a wireless network (e.g., an 802.11 network, a Wi-Fi network, etc.), a cellular network (e.g., a Long Term Evolution (LTE) network), a frame relay network, a virtual private network ("VPN"), a satellite network, a telephone network, routers, hubs, switches, server computers, and/or any combination thereof. Merely by way of example, the network 120 may include a cable network, a wireline network, a fiber-optic network, a telecommunications network, an intranet, a wireless local area network (WLAN), a metropolitan area network (MAN), a public telephone switched network (PSTN), a Bluetooth™ network, a ZigBee™ network, a near field communication (NFC) network, or the like, or any combination thereof. In some embodiments, the network 120 may include one or more network access points. For example, the network 120 may include wired and/or wireless network access points such as base stations and/or internet exchange points through which one or more components of the MRI system 100 may be connected to the network 120 to exchange data and/or information.

The terminal 130 include a mobile device 130-1, a tablet computer 130-2, a laptop computer 130-3, or the like, or any combination thereof. In some embodiments, the mobile device 130-1 may include a smart home device, a wearable device, a smart mobile device, a virtual reality device, an augmented reality device, or the like, or any combination thereof. In some embodiments, the smart home device may include a smart lighting device, a control device of an intelligent electrical apparatus, a smart monitoring device, a smart television, a smart video camera, an interphone, or the like, or any combination thereof. In some embodiments, the wearable device may include a smart bracelet, smart footgear, a pair of smart glasses, a smart helmet, a smart watch, smart clothing, a smart backpack, a smart accessory, or the like, or any combination thereof. In some embodiments, the smart mobile device may include a smartphone, a personal digital assistance (PDA), a gaming device, a navigation device, a point of sale (POS) device, or the like, or any combination thereof. In some embodiments, the virtual reality device and/or the augmented reality device may include a virtual reality helmet, a virtual reality glass, a virtual reality patch, an augmented reality helmet, an augmented reality glass, an augmented reality patch, or the like, or any combination thereof. For example, the virtual reality device and/or the augmented reality device may include a Google Glass, an Oculus Rift, a Hololens, a Gear VR, etc. In some embodiments, the terminal(s) 130 may remotely operate the MRI scanner 110. In some embodiments, the terminal(s) 130 may operate the MRI scanner 110 via a wireless connection. In some embodiments, the terminal(s) 130 may receive information and/or instructions inputted by a user, and send the received information and/or instructions to the MRI scanner 110 or to the processing device 140 via the network 120. In some embodiments, the terminal(s) 130 may receive data and/or information from the processing device 140. In some embodiments, the terminal(s) 130 may be part of the processing device 140. In some embodiments, the terminal(s) 130 may be omitted.

The processing device 140 may process data and/or information obtained from the MRI scanner 110, the terminal(s) 130, and/or the storage device 150. For example, the processing device 140 may process MR signals of one or more channels obtained from the MRI scanner 110 and reconstruct an image of the subject. In some embodiments, the reconstructed image may be transmitted to the terminal(s) 130 and displayed on one or more display devices in the terminal(s) 130. In some embodiments, the processing device 140 may be a single server, or a server group. The server group may be centralized, or distributed. In some embodiments, the processing device 140 may be local or remote. For example, the processing device 140 may access information and/or data stored in the MRI scanner 110, the terminal(s) 130, and/or the storage device 150 via the network 120. As another example, the processing device 140 may be directly connected to the MRI scanner 110, the terminal(s) 130, and/or the storage device 150 to access stored information and/or data. In some embodiments, the processing device 140 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof. In some embodiments, the processing device 140 may be implemented on a computing device 200 having one or more components illustrated in FIG. 2 in the present disclosure.

The storage device 150 may store data and/or instructions. In some embodiments, the storage device 150 may store data obtained from the terminal(s) 130 and/or the processing device 140. In some embodiments, the storage device 150 may store data and/or instructions that the processing device 140 may execute or use to perform exemplary methods described in the present disclosure. In some embodiments, the storage device 150 may include a mass storage device, a removable storage device, a volatile read-and-write memory, a read-only memory (ROM), or the like, or any combination thereof. Exemplary mass storage may include a magnetic disk, an optical disk, a solid-state drive, etc. Exemplary removable storage may include a flash drive, a floppy disk, an optical disk, a memory card, a zip disk, a magnetic tape, etc. Exemplary volatile read-and-write memory may include a random access memory (RAM). Exemplary RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. Exemplary ROM may include a mask ROM (MROM), a programmable ROM (PROM), an erasable programmable ROM (PEROM), an electrically erasable programmable ROM (EEPROM), a compact disk ROM (CD-ROM), and a digital versatile disk ROM, etc. In some embodiments, the storage device 150 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof.

In some embodiments, the storage device 150 may be connected to the network 120 to communicate with one or more components of the MRI system 100 (e.g., the processing device 140, the terminal(s) 130, etc.). One or more components of the MRI system 100 may access the data or instructions stored in the storage device 150 via the network 120. In some embodiments, the storage device 150 may be directly connected to or communicate with one or more components of the MRI system 100 (e.g., the processing device 140, the terminal(s) 130, etc.). In some embodiments, the storage device 150 may be part of the processing device 140.

FIG. 2 is a schematic diagram illustrating exemplary hardware and/or software components of an exemplary computing device 200 on which the processing device 140 may be implemented according to some embodiments of the present disclosure. As illustrated in FIG. 2, the computing device 200 may include a processor 210, a storage 220, an input/output (I/O) 230, and a communication port 240.

The processor 210 may execute computer instructions (program code) and perform functions of the processing device 140 in accordance with techniques described herein. The computer instructions may include, for example, routines, programs, objects, components, signals, data structures, procedures, modules, and functions, which perform particular functions described herein. For example, the processor 210 may process data obtained from the MRI scanner 110, the terminal(s) 130, the storage device 150, and/or any other component of the MRI system 100. Specifically, the processor 210 may process one or more measured data sets obtained from the MRI scanner 110. For example, the processor 210 may perform one-dimensional (1D) correction or two-dimensional (2D) correction for the measured data set(s). The processor 210 may reconstruct an image based on the corrected data set(s). In some embodiments, the reconstructed image may be stored in the storage device 150, the storage 220, etc. In some embodiments, the reconstructed image may be displayed on a display device by the I/O 230. In some embodiments, the processor 210 may perform instructions obtained from the terminal(s) 130. In some embodiments, the processor 210 may include one or more hardware processors, such as a microcontroller, a microprocessor, a reduced instruction set computer (RISC), an application specific integrated circuits (ASICs), an application-specific instruction-set processor (ASIP), a central processing unit (CPU), a graphics processing unit (GPU), a physics processing unit (PPU), a microcontroller unit, a digital signal processor (DSP), a field programmable gate array (FPGA), an advanced RISC machine (ARM), a programmable logic device (PLD), any circuit or processor capable of executing one or more functions, or the like, or any combinations thereof.

Merely for illustration, only one processor is described in the computing device 200. However, it should be noted that the computing device 200 in the present disclosure may also include multiple processors, thus operations and/or method steps that are performed by one processor as described in the present disclosure may also be jointly or separately performed by the multiple processors. For example, if in the present disclosure the processor of the computing device 200 executes both process A and process B, it should be understood that process A and process B may also be performed by two or more different processors jointly or separately in the computing device 200 (e.g., a first processor executes process A and a second processor executes process B, or the first and second processors jointly execute processes A and B).

The storage 220 may store data/information obtained from the MRI scanner 110, the terminal 130, the storage device 150, or any other component of the MRI system 100. In some embodiments, the storage 220 may include a mass storage device, a removable storage device, a volatile read-and-write memory, a read-only memory (ROM), or the like, or any combination thereof. For example, the mass storage may include a magnetic disk, an optical disk, a solid-state drive, etc. The removable storage may include a flash drive, a floppy disk, an optical disk, a memory card, a zip disk, a magnetic tape, etc. The volatile read-and-write memory may include a random access memory (RAM). The RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. The ROM may include a mask ROM (MROM), a programmable ROM (PROM), an erasable programmable ROM (PEROM), an electrically erasable programmable ROM (EEPROM), a compact disk ROM (CD-ROM), and a digital versatile disk ROM, etc. In some embodiments, the storage 220 may store one or more programs and/or instructions to perform exemplary methods described in the present disclosure. For example, the storage 220 may store a program for the processing device 140 for reducing or removing one or more artifacts in an image.

The I/O 230 may input or output signals, data, and/or information. In some embodiments, the I/O 230 may enable a user interaction with the processing device 140. In some embodiments, the I/O 230 may include an input device and an output device. Exemplary input devices may include a keyboard, a mouse, a touch screen, a microphone, or the like, or a combination thereof. Exemplary output devices may include a display device, a loudspeaker, a printer, a projector, or the like, or a combination thereof. Exemplary display devices may include a liquid crystal display (LCD), a light-emitting diode (LED)-based display, a flat panel display, a curved screen, a television device, a cathode ray tube (CRT), or the like, or a combination thereof.

The communication port 240 may be connected to a network (e.g., the network 120) to facilitate data communications. The communication port 240 may establish connections between the processing device 140 and the MRI scanner 110, the terminal 130, or the storage device 150. The connection may be a wired connection, a wireless connection, or combination of both that enables data transmission and reception. The wired connection may include an electrical cable, an optical cable, a telephone wire, or the like, or any combination thereof. The wireless connection may include Bluetooth, Wi-Fi, WiMax, WLAN, ZigBee, mobile network (e.g., 3G, 4G, 5G, etc.), or the like, or a combination thereof. In some embodiments, the communication port 240 may be a standardized communication port, such as RS232, RS485, etc. In some embodiments, the communication port 240 may be a specially designed communication port. For example, the communication port 240 may be designed in accordance with the digital imaging and communications in medicine (DICOM) protocol.

Figure 3:
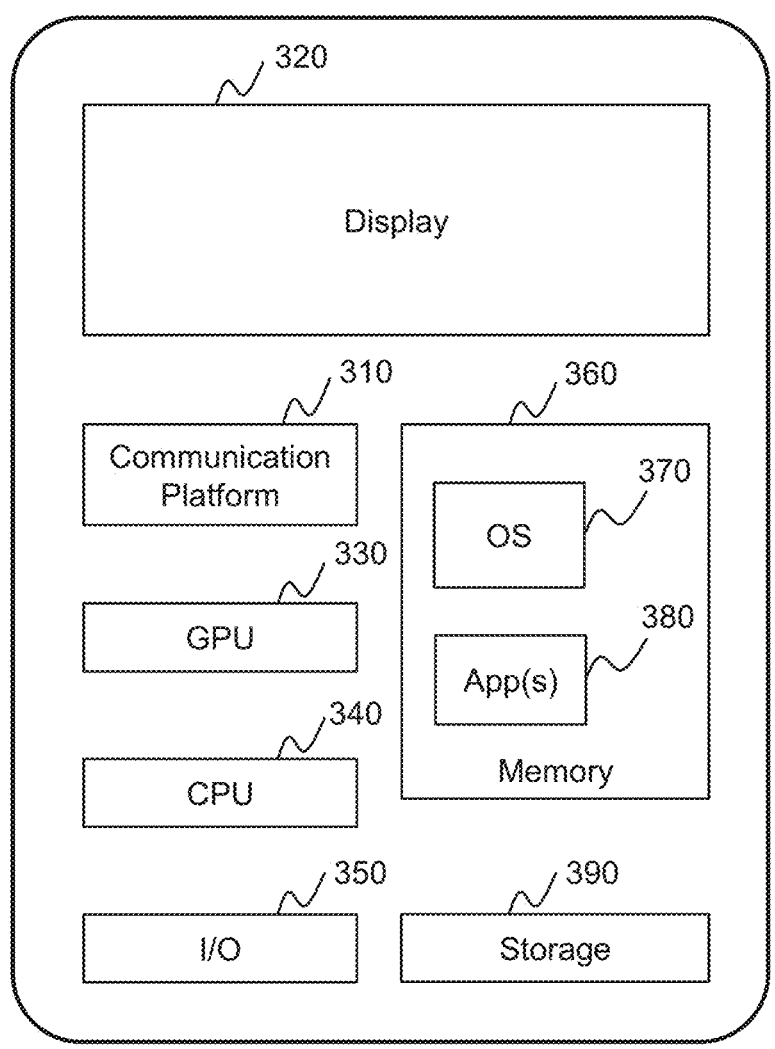
FIG. 3 is a schematic diagram illustrating exemplary hardware and/or software components of an exemplary mobile device according to some embodiments of the present disclosure.

FIG. 3 is a schematic diagram illustrating exemplary hardware and/or software components of an exemplary mobile device 300 according to some embodiments of the present disclosure. As illustrated in FIG. 3, the mobile device 300 may include a communication platform 310, a display 320, a graphic processing unit (GPU) 330, a central processing unit (CPU) 340, an I/O 350, a memory 360, and a storage 390. In some embodiments, any other suitable component, including but not limited to a system bus or a controller (not shown), may also be included in the mobile device 300. In some embodiments, a mobile operating system 370 (e.g., iOS, Android, Windows Phone, etc.) and one or more applications 380 may be loaded into the memory 360 from the storage 390 in order to be executed by the CPU 340. The applications 380 may include a browser or any other suitable mobile apps for receiving and rendering information relating to image processing or other information from the processing device 140. User interactions with the information stream may be achieved via the I/O 350 and provided to the processing device 140 and/or other components of the MRI system 100 via the network 120.

To implement various modules, units, and their functionalities described in the present disclosure, computer hardware platforms may be used as the hardware platform(s) for one or more of the elements described herein. The hardware elements, operating systems and programming languages of such computers are conventional in nature, and it is presumed that those skilled in the art are adequately familiar therewith to adapt those technologies to generate an image with reduced Nyquist ghost artifact as described herein. A computer with user interface elements may be used to implement a personal computer (PC) or other type of work station or terminal device, although a computer may also act as a server if appropriately programmed. It is believed that those skilled in the art are familiar with the structure, programming and general operation of such computer equipment and as a result the drawings should be self-explanatory.

Figure 4:
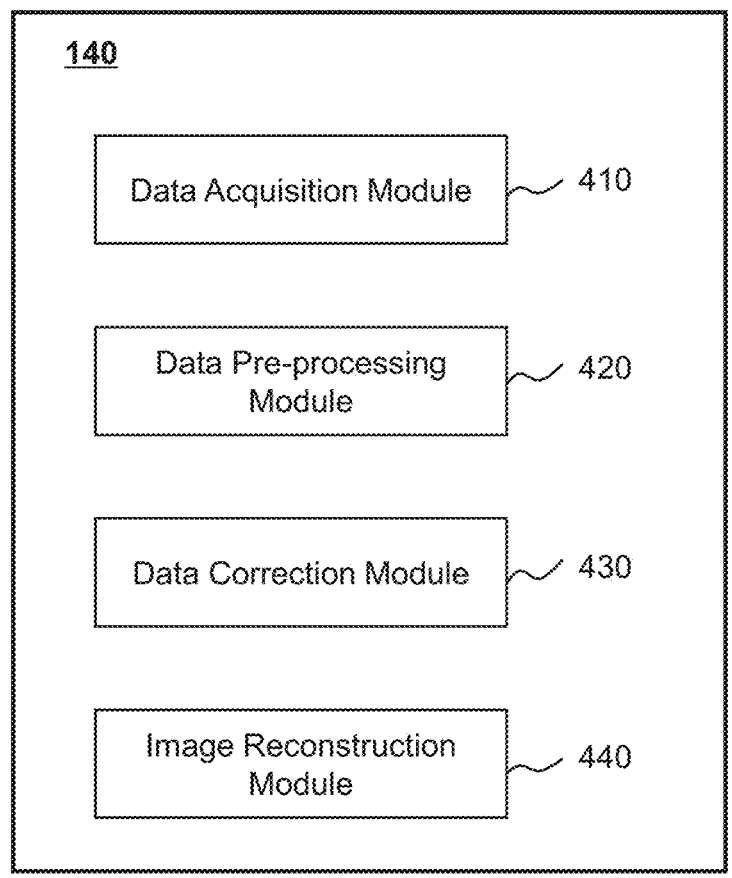
FIG. 4 is a block diagram illustrating an exemplary processing device according to some embodiments of the present disclosure.

FIG. 4 is a block diagram illustrating an exemplary processing device 140 according to some embodiments of the present disclosure. The processing device 140 may be implemented on the computing device 200 (e.g., the processor 210) illustrated in FIG. 2. The processing device 140 may include a data acquisition module 410, a data pre-processing module 420, a data correction module 430, and an image reconstruction module 440.

The data acquisition module 410 may be configured to acquire image data. In some embodiments, the data acquisition module 410 may acquire the image data (e.g., MR data) from the MRI scanner 110, the storage device 150, the terminal(s) 130, and/or an external data source (not shown). In some embodiments, the image data may include one or more measured data sets generated by echo planar imaging (EPI). In some embodiments, the data acquisition module 410 may acquire instructions for processing the measured data sets, or the like, or a combination thereof. In some embodiments, one or more radio frequency (RF) coils may be used for EPI. An RF coil may correspond to a channel. The RF coil(s) may receive the corresponding channel(s) of MR signal(s). A measured data set may correspond to a channel of MR signal received by an RF coil. In some embodiments, the measured data set(s) may be filled (or entered) into a data space (e.g., k-space) in a roundabout manner. The filled k-space may include one or more k-space data sets corresponding to the measured data set(s). The k-space data set(s) may include data corresponding to odd echoes and even echoes (see FIGS. 7A and 7B). In some embodiments, a measured data set may be and/or include a full k-space data set, i.e., the k-space data may be fully acquired. In some embodiments, a measured data set may be and/or include a partially filled k-space data set, i.e., the k-space data may be partially acquired. In some embodiments, the acquired instructions may be executed by the processor(s) of the processing device 140 to perform exemplary methods described in this disclosure. In some embodiments, the acquired data may be transmitted to the storage 200, the storage 390, the memory 360, etc. to be stored.

The data pre-processing module 420 may be configured to perform a preliminary correction for the measured data set(s) to generate one or more pre-processed data sets. A pre-processed data set may correspond to a measured data set. In some embodiments, the measured data set(s) may be preliminarily corrected in sequence to generate the pre-processed data set(s). Alternatively or additionally, the measured data set(s) may be preliminarily corrected simultaneously or synchronously to generate the pre-processed data set(s). In some embodiments, the preliminary correction may include a one-dimensional (1D) correction and/or a two-dimensional (2D) correction. The data pre-processing module 420 may preliminarily correct the measured data set(s) based on one or more correction algorithms, for example, a reference correction algorithm (i.e., correction based on a reference scan), an iteration correction (e.g., iterative phase cycling), etc.

Merely by way of example, the data pre-processing module 420 may preliminarily correct the measured data set(s) based on one or more reference data sets (e.g., reference echoes obtained by the data acquisition module 410). In some embodiments, the reference echoes may be detected without phase encoding. The data pre-processing module 420 may determine one or more correction parameters based on the reference echo(es). The correction parameter(s) may include phase deviation(s), phase deflection(s), phase offset(s), etc. The correction parameter(s) may be determined based on the phase differences between the reference echoes. Then the data pre-processing module 420 may preliminarily correct the measured data set(s) based on the correction parameter(s). More descriptions of the data correction may be found elsewhere in the present disclosure. See, for example, FIG. 8 and the description thereof.

The data correction module 430 may be configured to correct the measured data set(s) or pre-processed data set(s). The data correction module 430 may eliminate one or more phase inconsistencies of the measured data set(s) or pre-processed data set(s). In some embodiments, the data correction module 430 may generate one or more data sets that include reduced or no phase inconsistency. In some embodiments, the data correction module 430 may update the generated data sets. In some embodiments, the data correction module 430 may generate the data sets based on the pre-processed data set(s) or the measured data set(s). The generated data set(s) may be different from the pre-pro cessed data set(s) or the measured data set(s). The generated data set(s) may include combined data set(s). A combined data set may refer to a data set obtained by combining two or more known data sets or previously generated data sets. The data correction module 430 may generate a combined data set by combining two or more of a pre-processed data set, a measured data set, a synthetic data set generated based on one or more pre-processed data sets or measured data sets, or the like, or any combination thereof.

In some embodiments, the data correction module 430 may generate the combined data set(s) based on the pre-processed data set(s) or the measured data set(s) by performing one or more iteration(s). The iteration(s) may be terminated if the combined data set(s) satisfies one or more conditions (also referred to as termination criteria), and thus, the combined data set(s) may be determined. In some embodiments, the condition(s) may relate to a difference between the combined data sets generated in two consecutive iterations including a previous iteration and a current iteration. In response to the determination that the difference is greater than a first threshold, the data correction module 430 may determine to perform a next iteration. In response to the determination that the difference is lower than or equal to the first threshold, the data correction module 430 may determine to terminate the iteration(s). Then the combined data set(s) may be determined. In some embodiments, the condition(s) may relate to an iteration count representing the number of iterations that have been performed. In response to the determination that the iteration count is lower than a second threshold, the data correction module 430 may determine to perform a next iteration. In response to the determination that the iteration count is greater than or equal to the second threshold, the data correction module 430 may determine to terminate the iteration(s). Then the combined data set(s) may be determined. In some embodiments, the data correction module 430 may generate one or more convolution kernels, one or more synthetic data sets, etc. More description of the data correction module 430 can be found in connection with FIG. 5, and is not repeated here.

The image reconstruction module 440 may be configured to reconstruct one or more images. In some embodiments, the image reconstruction module 440 may reconstruct the image(s) based on one or more data sets (e.g., the measured data set(s), the pre-processed data set(s), and/or the combined data set(s)). The image reconstruction module 440 may reconstruct the image(s) based on a Fourier transform technique and/or one or more data filling techniques.

If the data set(s) (e.g., the measured data set(s), the pre-processed data set(s), and/or the combined data set(s)) are full k-space data set(s), the image reconstruction module 440 may reconstruct the image(s) according to a technique based on Fourier transform. The image reconstruction module 440 may process the data set(s) with an inverse Fourier transform to generate the image(s). Merely by way of example, the image reconstruction module 440 may perform an inverse Fourier transform for one of the data sets to generate a sub image. Thus, a plurality of sub images may be generated based on the data sets. A data set and the resultant sub image may correspond to a channel. The image reconstruction module 440 may generate an image by combining the sub images using a reconstruction technique. Exemplary reconstruction techniques may include "Sum of Squares" (SoS) reconstruction, optimal array reconstruction, etc. In some embodiments, the image reconstruction module 440 may determine one or more weights (or weighting factors) for the data set(s). The weight(s) of the data set(s) may be the same or different. The image reconstruction module 440 may combine the data set(s) based on the weight(s) to generate a reconstructed data set. The image reconstruction module 440 may perform an inverse Fourier transform for the reconstructed data set to obtain a reconstructed image.

If the data set(s) (e.g., the measured data set(s), the pre-processed data set(s), and/or the combined data set(s)) are partially filled k-space data set(s), the image reconstruction module 440 may reconstruct the image(s) according to a technique based on Fourier transform in combination with one or more data filling techniques. In some embodiments, the image reconstruction module 440 may reconstruct a full k-space data set by filling each of the partially filled k-space data set(s). Exemplary data filling techniques may include simultaneous acquisition of spatial harmonics (SMASH), AUTO-SMASH, VD (variable density)-AUTO-SMASH, sensitivity encoding (SENSE), modified SENSE (mSENSE), parallel imaging with localized sensitivities (PILS), generalized auto-calibrating partially parallel acquisitions (GRAPPA), iterative self-consistent parallel imaging reconstruction (SPIRiT), etc. Then the image reconstruction module 440 may process the full k-space data set with an inverse Fourier transform to generate an image. In some embodiments, the image reconstruction module 440 may process one full k-space data set corresponding to a channel with an inverse Fourier transform to generate one sub image. Thus, a plurality of sub images may be generated based on a plurality of full k-space data sets corresponding to the plurality of data sets. The image reconstruction module 440 may generate an image by combining the sub images using a reconstruction technique. Exemplary reconstruction techniques may include SoS reconstruction, optimal array reconstruction, etc.

It should be noted that the above description of the processing engine is provided for the purposes of illustration, and is not intended to limit the scope of the present disclosure. For persons having ordinary skills in the art, multiple variations and modifications may be made under the teachings of the present disclosure. However, those variations and modifications do not depart from the scope of the present disclosure. For example, the data pre-processing module 420 and the data correction module 430 may be integrated into one module configured to perform a preliminary correction on the measured data set(s) and generate one or more combined data sets. In some embodiments, one or more of the modules may be installed on a different device separated from the other modules. Merely by way of example, the image reconstruction module 440 may reside in a device, and other modules may reside on a different device.

Figure 5:
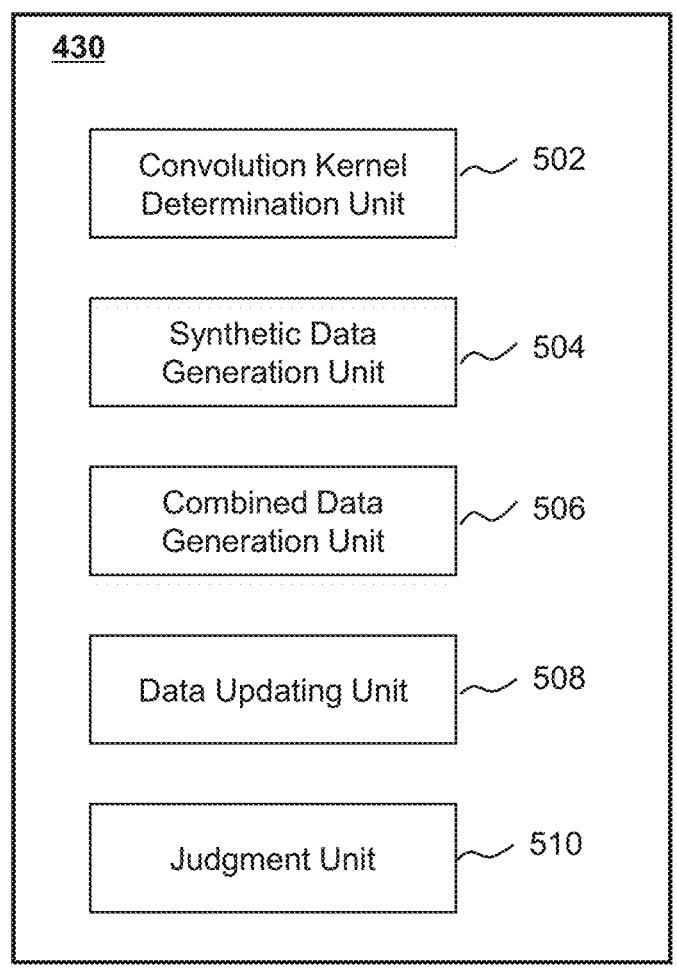
FIG. 5 is a block diagram illustrating an exemplary data correction module according to some embodiments of the present disclosure.

FIG. 5 is a block diagram illustrating an exemplary data correction module 430 according to some embodiments of the present disclosure. The data correction module 430 may be implemented on the computing device 200 (e.g., the processor 210) illustrated in FIG. 2. The data correction module 430 may include a convolution kernel determination unit 502, a synthetic data generation unit 504, a combined data generation unit 506, a data updating unit 508, and a judgment unit 510.

The convolution kernel determination unit 502 may be configured to determine one or more convolution kernels based on the measured data set(s) or pre-processed data set(s). In some embodiments, the number of convolution kernels may relate to the number of measured data set(s) or pre-processed data set(s) or the number of channels. In some embodiments, the convolution kernel determination unit 502 may determine one convolution kernel for a corresponding data set (e.g., a measured data set or pre-processed data set) or a corresponding channel. Merely by way of example, if there are 9 channels (i.e., 9 corresponding data sets), the convolution kernel determination unit 502 may determine 9 convolution kernels. In some embodiments, the convolution kernel determination unit 502 may determine one convolution kernel based on one or more of the corresponding data sets. For example, the convolution kernel determination unit 502 may determine a first convolution kernel for a first channel based on the data sets obtained from the first channel and one or more other channels (e.g., from all the channels). As another example, the convolution kernel determination unit 502 may determine a second convolution kernel for a second channel based on the data sets obtained from the second channel and one or more other channels (e.g., from all the channels). In some embodiments, the convolution kernels for multiple channels or corresponding data sets may be the same or different from each other.

A convolution kernel may refer to a matrix of a certain size that includes one or more elements. In some embodiments, a convolution kernel may be expressed as a data matrix with kx dimension (see FIG. 10B), ky dimension (see FIG. 10B), and/or a channel dimension. The range of a convolution kernel within the three dimensions (kx dimension, ky dimension, and the channel dimension) may be also referred to as a supporting range. The size of the convolution kernel may correspond to the size of the data matrix. The size of a convolution kernel may be determined based on the number of data points of a corresponding data set (e.g., a corresponding measured data set or pre-processed data set) and/or the number of channels. As the number of channels may be already known, the channel dimension of a convolution kernel may not be presented in the dimensions for brevity in the present disclosure. For example, a convolution kernel with a M×N×C matrix may be expressed as a M×N matrix for simplicity, wherein M is kx dimension, N is ky dimension, C is the number of channels, and the M×N matrix is referred to as the M×N×C matrix. In some embodiments, a convolution kernel may have a square shape, a rectangular shape, a triangular shape, an elliptical shape, a cuboid shape, a cylindrical shape, a hexagonal shape, etc. Merely by way of example, for a convolution kernel with a square shape for each channel, the convolution kernel may be a 3×3 matrix, a 5×5 matrix, etc. As another example, for a convolution kernel with a rectangular shape for each channel, the convolution kernel may be a 3×5 matrix, a 5×6 matrix, etc. In some embodiments, a convolution kernel may not have to include all surrounding data points. For example, a convolution kernel with a hexagonal shape for each channel may not include one or more data points surrounding the supporting range of the hexagonal shape. It should be noted that a data set (e.g., a measured data set, a pre-processed data set, a synthetic data set, a combined data set, etc.) described in the present disclosure may be expressed as a data matrix.

In some embodiments, the convolution kernel determination unit 502 may determine the convolution kernel(s) in k-space. Alternatively or additionally, the convolution kernel determination unit 502 may determine the convolution kernel(s) in an intermediate space. The intermediate space may be a data space between k-space and an image space. In some embodiments, the intermediate space may be determined by processing k-space with a 1D inverse Fourier transform.

In some embodiments, the convolution kernel determination unit 502 may generate a convolution kernel based on a portion of one or more corresponding data sets (e.g., all the corresponding data sets). In some embodiments, the portion of corresponding data sets may be located at any position of the corresponding data sets (e.g., a central region, a region close to an edge of the corresponding data sets). In some embodiments, all the corresponding data sets may be used to generate a convolution kernel. In some embodiments, the values for one or more elements of a convolution kernel may be determined by sliding the convolution kernel in k-space (or an intermediate space) and fit each target point (see, e.g., point T in FIG. 10A) using data points within the supporting range. A target point may refer to a known point (e.g., a known point in the measured (or pre-processed) data set(s)) at the center of the supporting range. In some embodiments, if at least one corresponding data set (e.g., a corresponding measured data set or the pre-processed data set) is or includes a partially filled k-space data set, the convolution kernel determination unit 502 may generate a convolution kernel based on a region including relatively dense data from the partially filled k-space data. In some embodiments, if the partially filled k-space data are not evenly distributed and a relatively dense area exists, the convolution kernel determination unit 502 may generate a convolution kernel based on the relatively dense area in the partially filled k-space data set. As used herein, "a region including relatively dense data" may indicate that the region includes an area that is filled with a larger amount of k-space data than another region of the partially filled k-space. For example, if an acceleration factor is 2 and the filled k-space data are not evenly distributed, the convolution kernel determination unit 502 may select a matrix containing relatively dense k-space data along the readout direction and the phase encoding direction. The acceleration factor may relate to a data sampling rate. For example, if the acceleration factor is 2, only half data may be sampled, and accordingly the sampling time may be halved. As used herein, that partially filled k-space data are evenly distributed may indicate that the ky intervals (i.e., the intervals in the ky direction) between the odd echoes and/or the even echoes corresponding to the partially filled k-space data are substantially the same. For evenly distributed data, the difference between a first ky interval and a second ky interval between the odd echoes and/or the even echoes corresponding to the partially filled k-space data may be less than a threshold relating to the ky interval. As used herein, that partially filled k-space data are not evenly distributed may indicate that the ky intervals between the odd echoes and/or the even echoes corresponding to the partially filled k-space data are substantially not the same. For non-evenly distributed data, the difference between a first ky interval and a second ky interval between the odd echoes and/or the even echoes corresponding to the partially filled k-space data may be no less than a threshold relating to the ky interval. Specifically, the convolution kernel may be generated by data fitting based on a kernel function and one or more data points of the corresponding data sets. More descriptions of the kernel function may be found elsewhere in the present disclosure. See, for example, Equation (1) and the description thereof.

The synthetic data generation unit 504 may be configured to generate one or more synthetic data sets. A synthetic data set may refer to a data set synthesized based on one or more known data sets (e.g., the measured data set(s), the pre-processed data set(s), the combined data set(s), etc.) or previously generated data sets. In some embodiments, the synthetic data generation unit 504 may generate a synthetic data set based on a convolution kernel and one or more corresponding data sets (e.g., all the measured data sets or pre-processed data sets). For example, the synthetic data generation unit 504 may generate a synthetic data set by traversing the corresponding data set(s) (e.g., all the measured data sets or pre-processed data sets) using a convolution kernel. In some embodiments, if there are multiple channels (i.e., multiple corresponding data sets), the synthetic data generation unit 504 may generate multiple synthetic data sets. For example, if there are 9 channels (i.e., 9 corresponding data sets), the synthetic data generation unit 504 may generate 9 synthetic data sets, in which each synthetic data set may be generated based on a convolution kernel and all the 9 corresponding data sets (e.g., all the measured data sets or pre-processed data sets). In some embodiments, the synthetic data generation unit 504 may generate multiple synthetic data sets simultaneously, or in sequence. In some embodiments, the synthetic data generation unit 504 may generate the synthetic data set(s) in k-space or the intermediate space. It should be noted that the synthetic data generation unit 504 may not fill a data set or increase the amount of data in a corresponding synthetic data set. For example, if a measured data set or a pre-processed data set includes a full k-space data set, a corresponding synthetic data set may be a substantially full k-space data set. As another example, if a measured data set or a pre-processed data set includes a partially filled k-space data set, a corresponding synthetic data set may still be a partially filled k-space data set.

The combined data generation unit 506 may be configured to generate one or more combined data sets. In some embodiments, the combined data generation unit 506 may generate a combined data set based on two or more known data sets. For example, the combined data generation unit 506 may generate a combined data set based on a synthetic data set and a measured (or pre-processed) data set. In some embodiments, the combined data generation unit 506 may generate multiple combined data sets based on multiple synthetic data sets and multiple measured (or pre-processed) data sets, in which each combined data set may relate to one of the synthetic data set(s) and the corresponding measured (or pre-processed) data set(s).

In some embodiments, the combined data generation unit 506 may generate the combined data set(s) based on one or more weighting factors (or weights). For example, the combined data generation unit 506 may determine a weighted sum of a synthetic data set and a corresponding measured (or pre-processed) data set based on the weighting factor(s). The combined data generation unit 506 may designate the weighted sum as a combined data set. In some embodiments, the weighting factor(s) for different combined data sets may be the same or different. It should be noted that the combined data generation unit 506 may generate the combined data set(s) based on one or more other algorithms, such as a relaxation iteration, an optimization algorithm, etc. The combined data generation unit 506 may generate the combined data set(s) in k-space or the intermediate space. If a synthetic data set includes a full k-space data set, the corresponding combined data set may still be a full k-space data set. If a synthetic data set includes partially filled k-space data set, the corresponding combined data set may still be a partially filled k-space data set.

The data updating unit 508 may be configured to update the convolution kernel(s) determined by the convolution kernel determination unit 502, the synthetic data set(s) generated by the synthetic data generation unit 504, and/or the combined data set(s) generated by the combined data generation unit 506 in one or more iterations. Merely by way of example, the data updating unit 508 may update the convolution kernel(s) in an iteration, update the synthetic data set(s) based on the updated convolution kernel(s), and then update the combined data set(s) based on the updated synthetic data set(s). In some embodiments, the data updating unit 508 may update the measured data set(s) or the pre-processed data set(s). For example, the data updating unit 508 may designate the combined data set(s) as the measured data set(s) or the pre-processed data set(s), and then update the convolution kernel(s) based on the updated measured data set(s) or the pre-processed data set(s). In some embodiments, the data updating unit 508 may update one or more parameters relating to an iteration algorithm, for example, an iteration count, time spent for iteration, etc. Merely by way of example, the data updating unit 508 may update an iteration count by counting the number of current iterations that have been performed.

The judgment unit 510 may be configured to determine whether the combined data set(s) satisfy a condition. In some embodiments, the condition may relate to the difference between the combined data sets generated in two or more consecutive iterations. The judgment unit 510 may determine whether the difference is greater than a first threshold. In some embodiments, in response to the determination that the difference is greater than the first threshold, the judgment unit 510 may determine to perform a next iteration. In some embodiments, in response to the determination that the difference is lower than or equal to the first threshold, the judgment unit 510 may determine to terminate the iteration(s). In some embodiments, the condition may relate to an iteration count representing the number of iterations that have been performed. The judgment unit 510 may determine whether the iteration count is greater than a second threshold. In response to the determination that the iteration count is lower than the second threshold, the judgment unit 510 may determine to perform a next iteration. In response to the determination that the iteration count is greater than or equal to the second threshold, the judgment unit 510 may determine to terminate the iteration(s). In some embodiments, the first threshold and/or the second threshold may be predetermined according to practical scenarios. The first threshold and/or the second threshold may be part of default settings of the processing device 140, or may be set or adjusted by a user (e.g., a doctor).

Figure 6:
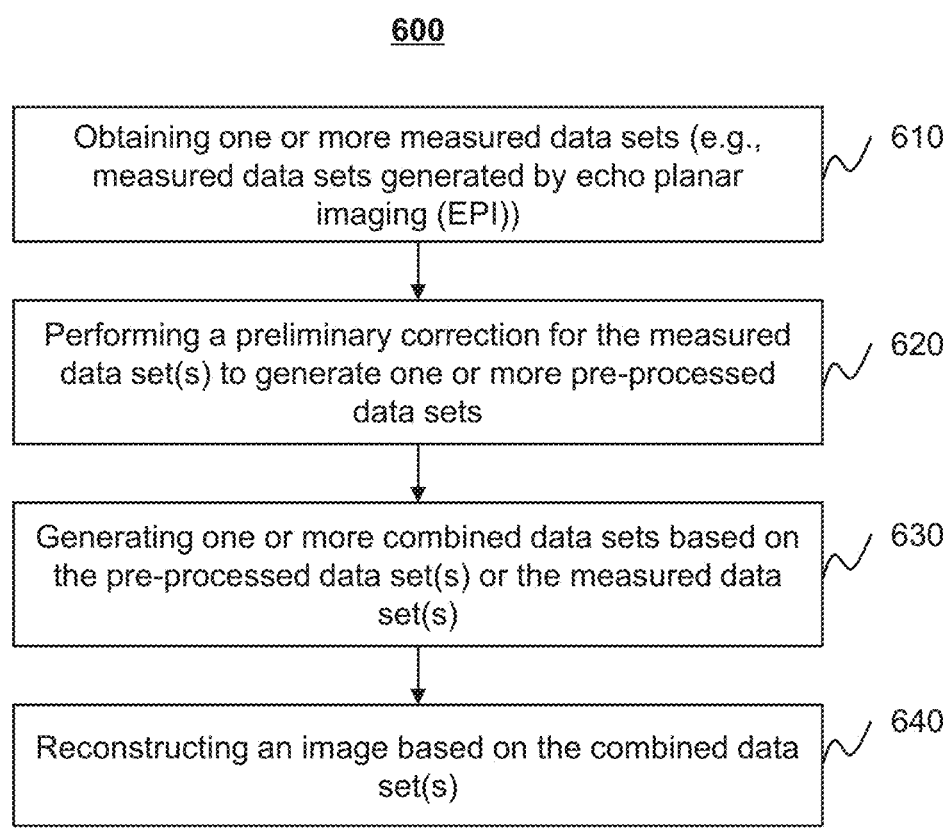
FIG. 6 is a flowchart illustrating an exemplary process for generating an image with reduced or no Nyquist ghost artifact according to some embodiments of the present disclosure.

FIG. 6 is a flowchart illustrating an exemplary process 600 for generating an image with reduced or no Nyquist ghost artifact according to some embodiments of the present disclosure. In some embodiments, one or more operations of process 600 illustrated in FIG. 6 for generating an image with reduced Nyquist ghost artifact may be implemented in the MRI system 100 illustrated in FIG. 1. For example, the process 600 illustrated in FIG. 6 may be stored in the storage device 150 in the form of instructions, and invoked and/or executed by the processing device 140 (e.g., the processor 210 of the computing device 200 as illustrated in FIG. 2, the CPU 340 of the mobile device 300 as illustrated in FIG. 3). As another example, a portion of the process 600 may be implemented on the MRI scanner 110. The operations of the illustrated process presented below are intended to be illustrative. In some embodiments, the process may be accomplished with one or more additional operations not described, and/or without one or more of the operations discussed. Additionally, the order in which the operations of the process as illustrated in FIG. 6 and described below is not intended to be limiting.

Figure 7A:
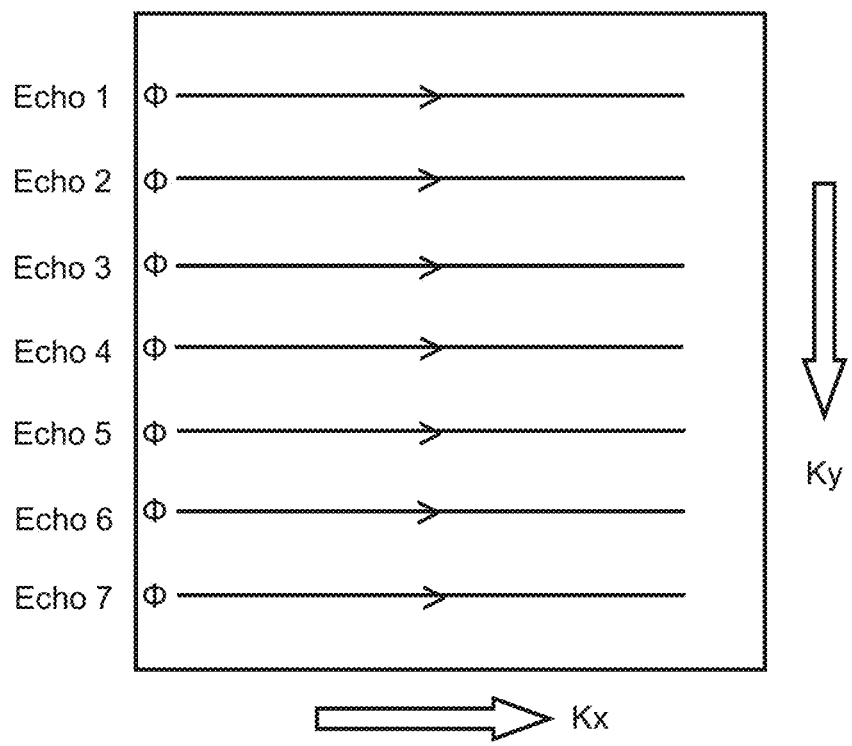
FIGS. 7A and 7B are schematic diagrams illustrating exemplary echoes filled into k-space according to some embodiments of the present disclosure.
Figure 7B:
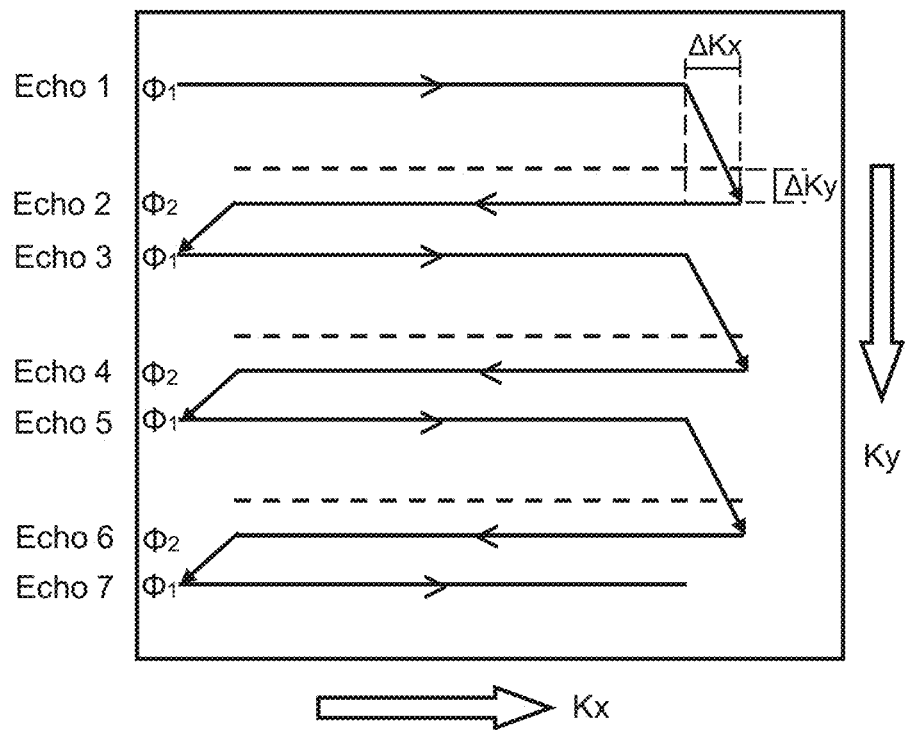

In 610, one or more measured data sets may be obtained. The operation 610 may be performed by the data acquisition module 410. In some embodiments, the measured data sets may be generated by echo planar imaging (EPI). EPI is a bi-polar readout scan technique. In some embodiments, one or more radiofrequency (RF) coils may be used for EPI. An RF coil may correspond to a channel. An EPI scan may produce a train or series of gradient echoes (also referred to as successive MR signals). The RF coil(s) may receive MR signal(s) from the corresponding channel(s). A measured data set may correspond to an MR signal from a channel received by an RF coil. The measured data set(s) may be filled in a data space (e.g., k-space) in a roundabout manner. The filled k-space may include one or more k-space data sets corresponding to the measured data set(s). The k-space data set(s) may include data corresponding to one or more odd echoes and one or more even echoes (as shown in FIGS. 7A and 7B). In some embodiments, a measured data set may be and/or include a full k-space data set, i.e., the k-space data may be fully acquired (or filled) by way of sampling, data filling, etc. In some embodiments, a measured data set may be and/or include a partially filled k-space data set, i.e., the k-space data may be partially acquired (or filled).

In 620, a preliminary correction may be performed for the measured data set(s) obtained in 610 to generate one or more pre-processed data sets. The operation 620 may be performed by the data pre-processing module 420. A pre-processed data set may correspond to a measured data set. In some embodiments, multiple measured data sets may be corrected in sequence to generate the pre-processed data set(s). Alternatively or additionally, multiple measured data sets may be corrected simultaneously or synchronously to generate the pre-processed data set(s). In some embodiments, the preliminary correction may include a 1D correction and/or a 2D correction. An exemplary preliminary correction is described in connection with FIG. 8, and is not repeated here. In some embodiments, operation 620 may be omitted. Thus, the measured data set(s) without preliminary correction may be used for further processing (e.g., for generating one or more combined data sets).

In 630, one or more combined data sets may be generated based on the pre-processed data set(s) or the measured data set(s). The operation 630 may be performed by the data correction module 430. A combined data set may relate to a corresponding pre-processed data set or a corresponding measured data set. In some embodiments, the combined data set(s) may be generated by performing one or more iterations based on the pre-processed data set(s) or the measured data set(s). In some embodiments, the combined data set(s) may be updated in the iteration(s). The iteration(s) are described in detail in connection with FIG. 9, and are not repeated here. The iteration(s) may be terminated if the combined data set(s) satisfy one or more conditions, and the combined data set(s) may be determined. In some embodiments, the condition(s) may relate to a difference between the combined data sets generated in two or more consecutive iterations. In response to the determination that the difference is greater than a first threshold, the data correction module 430 may determine to perform a next iteration. In response to the determination that the difference is lower than or equal to the first threshold, the data correction module 430 may determine to terminate the iteration(s). Then the combined data set(s) may be determined. In some embodiments, the condition(s) may relate to an iteration count representing the number of iterations that have been performed. In response to the determination that the iteration count is lower than a second threshold, the data correction module 430 may determine to perform a next iteration. In response to the determination that the iteration count is greater than or equal to a second threshold, the data correction module 430 may determine to terminate the iteration(s). Then the combined data set(s) may be determined. The first threshold and/or the second threshold may be predetermined according to practical scenarios. The first threshold and/or the second threshold may be part of default settings of the processing device 140, or may be set or adjusted by a user (e.g., a doctor).

In 640, an image may be reconstructed based on the combined data set(s). The operation 640 may be performed by the image reconstruction module 440. In some embodiments, the image may be reconstructed according to a technique based on Fourier transform and/or one or more data filling techniques.

If the combined data set(s) are full k-space data set(s), the image may be reconstructed according to a technique based on Fourier transform. The combined data set(s) may be processed with an inverse Fourier transform to generate the image. In some embodiments, one of the combined data sets may be processed with an inverse Fourier transform to generate a sub image. Thus, a plurality of sub images may be generated based on the combined data sets. A combined data set and the resultant sub image may correspond to a channel. Then an image may be generated by combining the sub images using a reconstruction technique. Exemplary reconstruction techniques may include "Sum of Squares" (SoS) reconstruction, optimal array reconstruction, etc. In some embodiments, the image reconstruction module 440 may determine one or more weights (or weighting factors) for the combined data set(s). The weight(s) of the combined data set(s) may be the same or different. The image reconstruction module 440 may combine the combined data set(s) based on the weight(s) to generate a reconstructed data set. The image reconstruction module 440 may perform an inverse Fourier transform for the reconstructed data set to obtain a reconstructed image.

If the combined data set(s) are partially filled k-space data set(s), the image reconstruction module 440 may reconstruct an image according to a technique based on Fourier transform in combination with one or more data filling techniques. In some embodiments, the image reconstruction module 440 may reconstruct a full k-space data set by filling each of the combined data set(s) (or partially filled k-space data set(s)). Exemplary data filling techniques may include simultaneous acquisition of spatial harmonics (SMASH), AUTO-SMASH, VD (variable density)-AUTO-SMASH, sensitivity encoding (SENSE), modified SENSE (mSENSE), parallel imaging with localized sensitivities (PILS), generalized auto-calibrating partially parallel acquisitions (GRAPPA), iterative self-consistent parallel imaging reconstruction (SPIRiT), etc. Then the image reconstruction module 440 may process the full k-space data set with an inverse Fourier transform to generate an image. In some embodiments, the image reconstruction module 440 may process one full k-space data set corresponding to a channel with an inverse Fourier transform to generate one sub image. Thus, a plurality of sub images may be generated based on a plurality of full k-space data sets corresponding to the plurality of combined data sets. The image reconstruction module 440 may generate an image by combining the sub images using a reconstruction technique. Exemplary reconstruction techniques may include SoS reconstruction, optimal array reconstruction, etc.

It should be noted that the above description of the process for generating an image with reduced or no Nyquist ghost artifact is provided for the purposes of illustration, and is not intended to limit the scope of the present disclosure. For persons having ordinary skills in the art, multiple variations and modifications may be made under the teachings of the present disclosure. However, those variations and modifications do not depart from the scope of the present disclosure. In some embodiments, k-space may be processed with a one-dimensional (1D) inverse Fourier transform to determine an intermediate space. The intermediate space may be between k-space and an image space. The k-space data set(s) may be processed with the 1D inverse Fourier transform to generate one or more intermediate space data set(s). The intermediate space data set(s) may correspond to the k-space data set(s). The intermediate space data set(s) may be used for processing to generate an image with reduced or no Nyquist ghost artifact.

In some embodiments, another exemplary process for generating an image (e.g., an MR image) may include one or more of the following operations. A plurality of magnetic resonance (MR) signals may be generated by scanning a subject using an imaging device (e.g., an MR imaging device). The plurality of MR signals may be received using a plurality of radiofrequency (RF) coils of the imaging device. A plurality of measured k-space data sets may be obtained by entering (also referred to as filling) the MR signals into k-space, wherein each measured k-space data set may correspond to one of the plurality of RF coils. One or more corrections may be performed for the plurality of measured k-space data sets to obtain a plurality of corrected k-space data sets. An image related to the subject may be reconstructed based on the plurality of corrected k-space data sets. In some embodiments, the one or more corrections may include one or more of the following operations. A plurality of convolution kernels may be determined based on the plurality of measured k-space data sets (see, e.g., operation 901). A plurality of synthetic k-space data sets may be generated based on the plurality of convolution kernels and the plurality of measured k-space data sets (see, e.g., operation 903). The plurality of corrected k-space data sets may be generated based on the plurality of synthetic k-space data sets and the plurality of measured k-space data sets (see, e.g., operation 905). In some embodiments, before determining the plurality of convolution kernels, a linear or non-linear correction (e.g., a linear or non-linear preliminary correction) may be performed for the plurality of measured k-space data sets. The linear or non-linear correction may be any 1D correction or 2D correction described in the present disclosure. In some embodiments, the determination of the plurality of convolution kernels may include one or more of the following operations. The plurality of measured k-space data sets may be processed with one-dimensional (1D) inverse Fourier transform to obtain an intermediate image. The plurality of convolution kernels may be determined based on the intermediate image. In some embodiments, the intermediate image may be an image correspond to the data in an intermediate space.

FIGS. 7A and 7B are schematic diagrams illustrating exemplary echoes filled into k-space according to some embodiments of the present disclosure. FIG. 7A shows ideal echoes filled in k-space. As shown in FIG. 7A, there may be no inconsistencies between echoes (e.g., echo 1 through echo 7). Specifically, the echoes (e.g., echo 1 through echo 7) may have the same eddy current induced phase (e.g., $\phi$) and delays along both the readout direction (Kx) and phase encoding direction (Ky). Accordingly, an image reconstructed based on the k-space data shown in FIG. 7A may include no Nyquist ghost artifact.

Figure 11A:
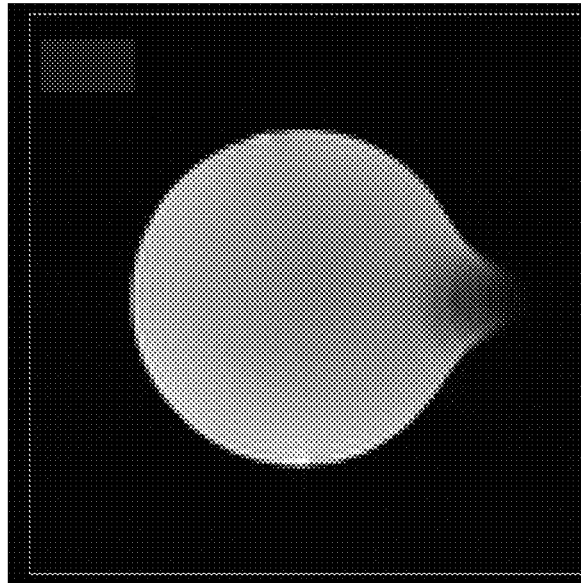
FIGS. 11A and 11B are exemplary images processed by 1D correction with different brightness.
Figure 11B:
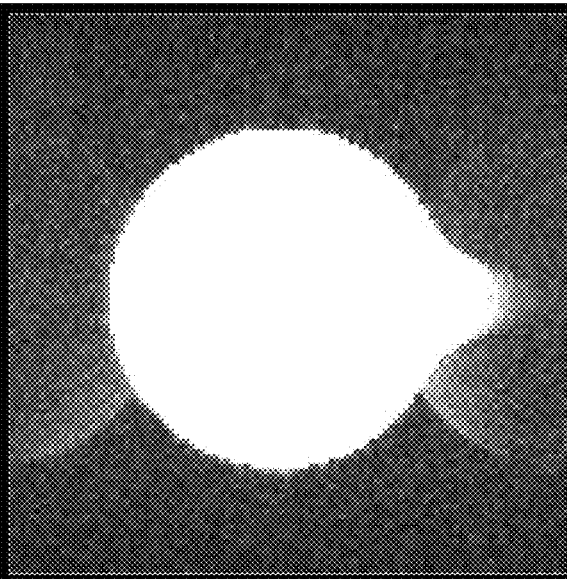
Figure 11C:
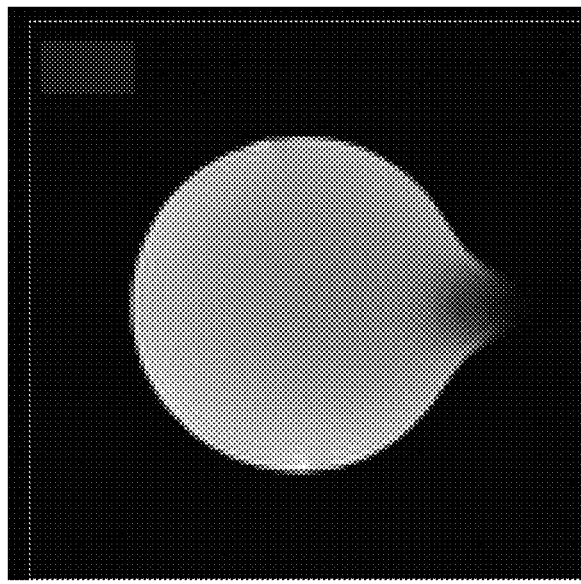
FIGS. 11C and 11D are exemplary images processed by 2D correction with different brightness.
Figure 11D:
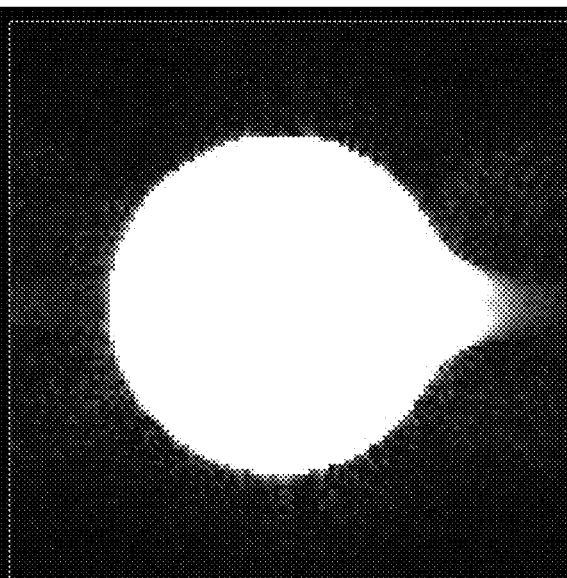

FIG. 7B shows echoes filled in k-space that include inconsistencies. In some embodiments, the echoes shown in FIG. 7B may be generated by EPI. EPI is a bi-polar readout scan technique. A gradient pulse sequence may be used for an EPI scan. A gradient pulse sequence may include a train of gradient pulses of continually alternating polarities in the readout direction (i.e., Kx direction in FIG. 7B), and a train of gradient pulses in the phase encoding direction (i.e., Ky direction in FIG. 7B). The EPI scan may produce a corresponding train or series of gradient echoes (also referred to as successive MR signals). The echoes may be designated as "odd" (e.g., echo 1, echo 3, echo 5, and echo 7 in FIG. 7B) or "even" (e.g., echo 2, echo 4, and echo 6 in FIG. 7B) based on their respective positions in the echo train. The odd echoes and the even echoes may be acquired with opposite readout gradient polarities, respectively. Accordingly, MR data corresponding to the MR signals may be filled into k-space in a roundabout manner, and roundabout echoes may be generated in k-space. However, due to eddy current induced by the high-speed switching of a gradient magnetic field with different polarities, a shift, etc., inconsistencies between the odd echoes and the even echoes may be generated. The inconsistencies in k-space data may in turn lead to Nyquist ghost artifact in a reconstructed image. As shown in FIG. 7B, the inconsistencies may include different phases (e.g., $\phi_1$ and $\phi_2$), delay along the readout direction (e.g., $\Delta Kx$), and shift along the phase encoding direction (e.g., $\Delta Ky$). In some embodiments, the different phases and delay along the Kx direction may be corrected at least to some extent by performing a one-dimensional (1D) correction. However, there may still be artifact in a reconstructed image (as shown in FIGS. 11A and 11B). A two-dimensional (2D) correction may be performed to reduce or remove the Nyquist ghost artifact. The 2D correction technique described in the present disclosure (see, e.g., FIGS. 6 and 9) may substantially eliminate Nyquist ghost artifact (as shown in FIGS. 11C and 11D). It should be noted that the 2D correction technique described in the present disclosure may eliminate or reduce the phase differences between even echoes and odd echoes without using extra calibration data or reference data.

It should be noted that the above illustrated echoes in k-space is provided for the purposes of illustration, and is not intended to limit the scope of the present disclosure. For persons having ordinary skills in the art, multiple variations and modifications may be made under the teachings of the present disclosure. However, those variations and modifications do not depart from the scope of the present disclosure. For example, the echoes may only include differences along the readout direction.

Figure 8:
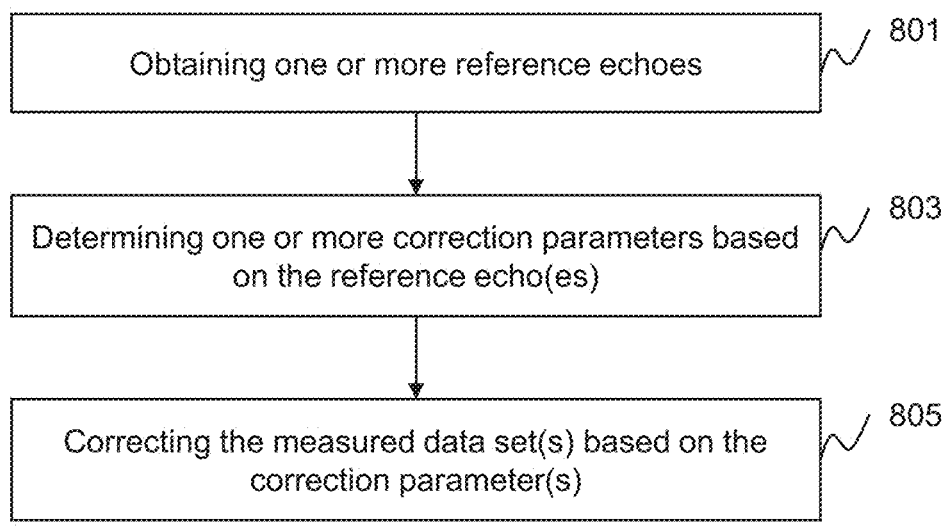
FIG. 8 is a flowchart illustrating an exemplary process for performing a preliminary correction for measured data set(s) according to some embodiments of the present disclosure.

FIG. 8 is a flowchart illustrating an exemplary process 800 for performing a preliminary correction for measured data set(s) according to some embodiments of the present disclosure. In some embodiments, one or more operations of process 800 illustrated in FIG. 8 for performing a preliminary correction may be implemented in the MRI system 100 illustrated in FIG. 1. For example, the process 800 illustrated in FIG. 8 may be stored in the storage device 150 in the form of instructions, and invoked and/or executed by the processing device 140 (e.g., the processor 210 of the computing device 200 as illustrated in FIG. 2, the CPU 340 of the mobile device 300 as illustrated in FIG. 3). As another example, a portion of the process 800 may be implemented on the MRI scanner 110. In some embodiments, operation 620 illustrated in FIG. 6 may be performed according to process 800. The operations of the illustrated process presented below are intended to be illustrative. In some embodiments, the process may be accomplished with one or more additional operations not described, and/or without one or more of the operations discussed. Additionally, the order in which the operations of the process as illustrated in FIG. 8 and described below is not intended to be limiting.

In some embodiments, the preliminary correction may include a one-dimensional (1D) correction for reducing inconsistencies between odd-even echoes. Generally, the 1D correction may correct phase and delay along the readout direction (e.g., different phases $\phi_1$ and $\phi_2$, and $\Delta Kx$ in FIG. 7B). After the 1D correction, the pre-processed data set(s) may be used for generating the combined data set(s). Merely by way of example, a 1D correction technique is described below.

In 801, one or more reference echoes may be obtained. The operation 801 may be performed by the data pre-processing module 420. In some embodiments, the data pre-processing module 420 may obtain data relating to the reference echoes via the data acquisition module 410. The reference echo(es) may be echoes detected without phase encoding. In some embodiments, the number of the reference echo(es) may be three, including two even echoes and an odd echo (e.g., a first even echo, a second odd echo, and a third even echo). In some embodiments, the number of the reference echo(es) may be four, including two even echoes and two odd echoes.

In 803, one or more correction parameters may be determined based on the reference echo(es) obtained in 801. The operation 803 may be performed by the data pre-processing module 420. The correction parameter(s) may relate to one or more phase deviations, one or more phase deflections, one or more phase offsets, etc., of the reference echo(es). The correction parameter(s) may be determined based on phase differences of the reference echo(es) after 1D inverse Fourier transform along the readout direction. For example, if the number of the reference echo(es) is three, the phase difference may refer to a phase difference between an even echo and an odd echo (e.g., a first even echo and a second odd echo, a second odd echo and a third even echo). In some embodiments, the data pre-processing module 420 may perform a 1D inverse Fourier transform for the reference echo(es) along the readout direction. The data pre-processing module 420 may determine the phase differences of the transformed reference echo(es).

In 805, the measured data set(s) may be corrected based on the correction parameter(s) determined in 803. The operation 805 may be performed by the data pre-processing module 420. In some embodiments, the data pre-processing module 420 may perform a 1D inverse Fourier transform for the measured data set(s) along the readout direction to generate one or more intermediate data sets. The data pre-processing module 420 may correct the intermediate data set(s) based on the correction parameter(s).

It should be noted that the above description of the process 800 for performing the 1D correction for the measured data set(s) is provided for the purposes of illustration, and is not intended to limit the scope of the present disclosure. For persons having ordinary skills in the art, multiple variations and modifications may be made under the teachings of the present disclosure. However, those variations and modifications do not depart from the scope of the present disclosure. In some embodiments, a fitting model may be determined based on the reference echoes and readout positions. The measured data set(s) may be corrected based on the fitting model. More descriptions of the 1D correction may be found in, e.g., Chinese Patent Nos. 104035059 entitled "METHOD FOR RECONSTRUCTING IMAGE PRODUCED BY ECHO PLANAR IMAGING SEQUENCE" filed Mar. 6, 2013, and 104865545 entitled "METHOD AND DEVICE FOR ECHO PLANAR IMAG-ING" filed Feb. 21, 2014, the contents of each of which are hereby incorporated by reference.

Figure 9:
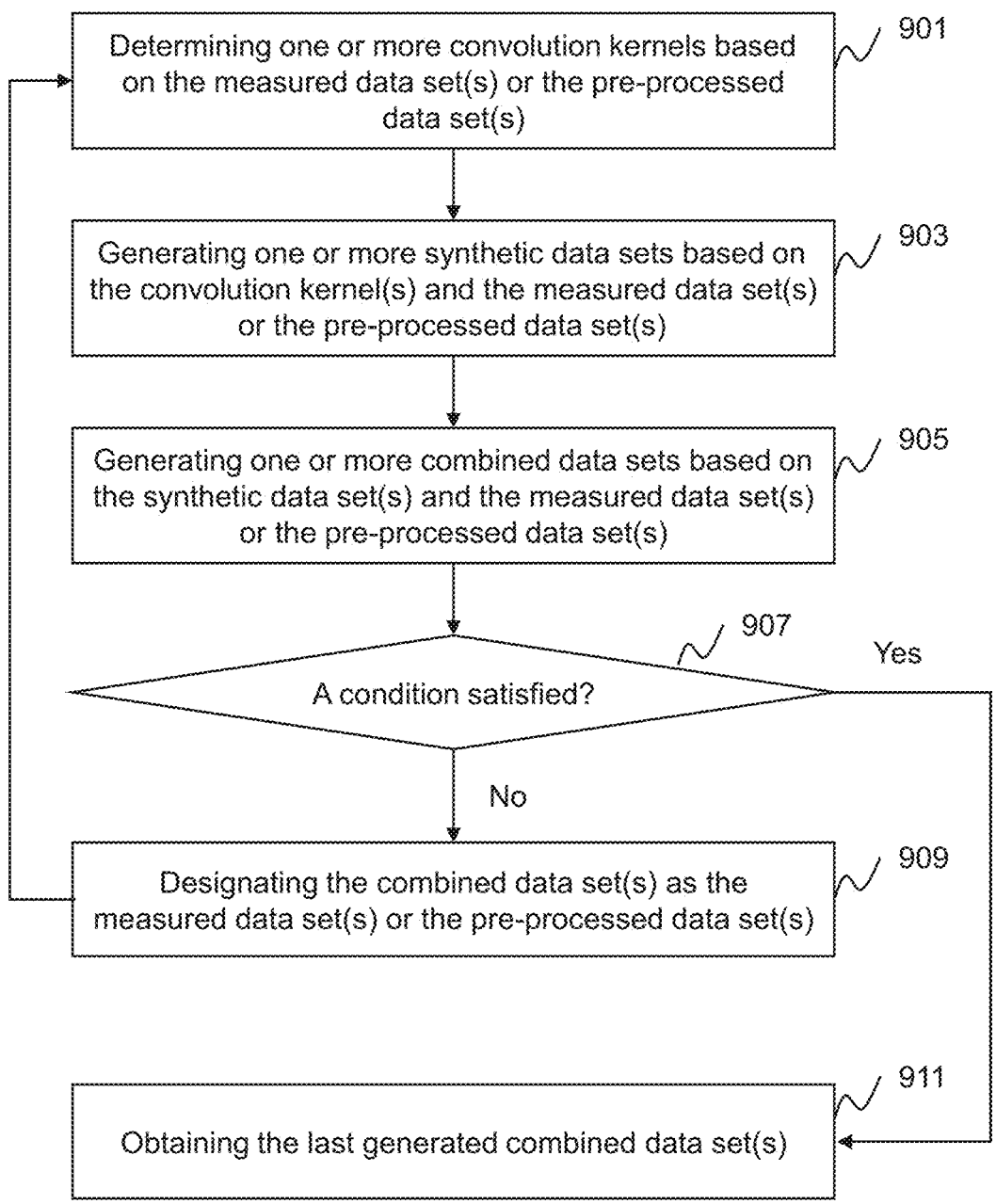
FIG. 9 is a flowchart illustrating an exemplary process for generating one or more combined data sets according to some embodiments of the present disclosure.

FIG. 9 is a flowchart illustrating an exemplary process 900 for generating one or more combined data sets according to some embodiments of the present disclosure. In some embodiments, one or more operations of process 900 illustrated in FIG. 9 for generating combined data set(s) may be implemented in the MRI system 100 illustrated in FIG. 1. For example, the process 900 illustrated in FIG. 9 may be stored in the storage device 150 in the form of instructions, and invoked and/or executed by the processing device 140 (e.g., the processor 210 of the computing device 200 as illustrated in FIG. 2, the CPU 340 of the mobile device 300 as illustrated in FIG. 3). As another example, a portion of the process 900 may be implemented on the MRI scanner 110. In some embodiments, operation 630 illustrated in FIG. 6 may be performed according to process 900. The operations of the illustrated process presented below are intended to be illustrative. In some embodiments, the process may be accomplished with one or more additional operations not described, and/or without one or more of the operations discussed. Additionally, the order in which the operations of the process as illustrated in FIG. 9 and described below is not intended to be limiting.

In 901, one or more convolution kernels may be determined based on the measured data set(s) obtained in 610 or the pre-processed data set(s) generated in 620. The operation 901 may be performed by the convolution kernel determination unit 502. In some embodiments, the convolution kernel(s) may be determined in k-space. Alternatively or additionally, the convolution kernel(s) may be determined in an intermediate space between k-space and an image space. In some embodiments, the convolution kernel determination unit 502 may determine one convolution kernel for a corresponding data set (e.g., a measured data set or pre-processed data set) or a corresponding channel. In some embodiments, each measured data set or each pre-processed data set may have a corresponding convolution kernel. Merely by way of example, if there are 9 channels (i.e., 9 corresponding data sets), the convolution kernel determination unit 502 may determine 9 convolution kernels. In some embodiments, the convolution kernel determination unit 502 may determine one convolution kernel based on one or more of the corresponding data sets (e.g., all the 9 corresponding data sets or 9 channels). In some embodiments, each convolution kernel may relate to all of the measured data set(s) or the pre-processed data set(s). For example, the convolution kernel determination unit 502 may determine a first convolution kernel for a first channel based on the data sets obtained from the first channel and one or more other channels (e.g., from all the channels). As another example, the convolution kernel determination unit 502 may determine a second convolution kernel for a second channel based on the data sets obtained from the second channel and one or more other channels (e.g., from all the channels). In some embodiments, the convolution kernels for multi channels or corresponding data sets may be different from each other. For example, the values of the elements of at least two convolution kernels may be different. As another example, the sizes of at least two convolution kernels may be different. As a further example, the shapes of at least two convolution kernels may be different.

In some embodiments, the convolution kernel determination unit 502 may generate a convolution kernel based on a portion of one or more corresponding data sets (e.g., all the corresponding data sets). In some embodiments, the portion of corresponding data sets may be located at any position of the corresponding data sets (e.g., a central region, a region close to an edge of the corresponding data sets). In some embodiments, all the corresponding data sets may be used to generate a convolution kernel. In some embodiments, the values for one or more elements of a convolution kernel may be determined by sliding the convolution kernel in k-space (or an intermediate space) and fit each target point (see, e.g., point T in FIG. 10A) using data points within the supporting range. A target point may refer to a known point (e.g., a known point in the measured (or pre-processed) data set(s)) at the center of the supporting range. In some embodiments, if at least one corresponding data set (e.g., a corresponding measured data set or the pre-processed data set) is or includes a partially filled k-space data set, the convolution kernel determination unit 502 may generate a convolution kernel based on a region including relatively dense data from the partially filled k-space data. In some embodiments, if the partially filled k-space data are not evenly distributed and a relatively dense area exists, the convolution kernel determination unit 502 may generate a convolution kernel based on the relatively dense area in the partially filled k-space data set. As used herein, "a region including relatively dense data" may indicate that the region includes an area that is filled with a larger amount of k-space data than another region of the partially filled k-space. For example, if an acceleration factor is 2 and the filled k-space data are not evenly distributed, the convolution kernel determination unit 502 may select a matrix containing relatively dense k-space data along the readout direction and the phase encoding direction. The acceleration factor may relate to a data sampling rate. For example, if the acceleration factor is 2, only half data may be sampled, and accordingly the sampling time may be halved. As used herein, that partially filled k-space data are evenly distributed may indicate that the ky intervals (i.e., the intervals in the ky direction) between the odd echoes and/or the even echoes corresponding to the partially filled k-space data are substantially the same. For evenly distributed data, the difference between a first ky interval and a second ky interval between the odd echoes and/or the even echoes corresponding to the partially filled k-space data may be less than a threshold relating to the ky interval. As used herein, that partially filled k-space data are not evenly distributed may indicate that the ky intervals between the odd echoes and/or the even echoes corresponding to the partially filled k-space data are substantially not the same. For non-evenly distributed data, the difference between a first ky interval and a second ky interval between the odd echoes and/or the even echoes corresponding to the partially filled k-space data may be no less than a threshold relating to the ky interval.

In some embodiments, a convolution kernel may be determined by data fitting based on a kernel function and one or more data points of the corresponding data set(s). For the purposes of illustration, an exemplary kernel function may be expressed as Equation (1):

$$S_l(k_x, k_y) = \Sigma_{l,p,n}(l, k_x - p\Delta k_x, k_y - q\Delta k_y) S_l(l, k_x - p\Delta k_x, k_y - q\Delta k_y),$$  (1)

where $S_l(k_x, k_y)$ may represent measured data or pre-processed data of a point $(k_x, k_y)$ of a channel l (or a k-space data set); l may represent a channel number, $(k_x, k_y)$ may represent a data point in k-space; p may represent a location along the readout $(k_x)$ direction; q may represent a location along the phase encoding $(k_y)$ direction; and n may represent a weight for the channel l (or a k-space data set).

As shown in Equation (1), in the determination of a convolution kernel, the weight n is unknown, and the other parameters are known. By performing data fitting, the weight n may be determined. In some embodiments, the data fitting may be performed based on a least square fitting technique. In some embodiments, one or more weights may be determined to form a convolution kernel.

In 903, one or more synthetic data sets may be generated based on the convolution kernel(s) and the measured data set(s) or the pre-processed data set(s). The operation 903 may be performed by the synthetic data generation unit 504. The synthetic data set(s) may be determined in k-space or an intermediate space. A synthetic data set may relate to a corresponding convolution kernel and one or more measured data sets or pre-processed data sets (e.g., all the measured (or pre-processed) data sets). In some embodiments, a synthetic data set may be determined based on a convolution of a corresponding convolution kernel and the measured (or pre-processed) data sets (e.g., all the measured (or pre-processed) data sets). For example, for a convolution kernel with a 3×3×C (C is the number of channels) size (e.g., the convolution kernel 1012 in FIG. 10B), a synthetic data set (e.g., the synthetic data set 1022 in FIG. 10C) corresponding to the convolution kernel 1012 may be generated by traversing the data sets (e.g., the measured (or pre-processed) data sets) using the convolution kernel 1012. In some embodiments, one or more synthetic data sets may be generated, in which each synthetic data set may be generated based on the measured (or pre-processed) data sets and the corresponding convolution kernel. For example, if there are 9 channels (i.e., 9 corresponding measured data sets or pre-processed data sets), the synthetic data generation unit 504 may generate 9 synthetic data sets.

In some embodiments, if a measured data set or a pre-processed data set includes a full k-space data set, a corresponding synthetic data set may be a substantially full k-space data set. In some embodiments, if a measured data set or a pre-processed data set includes a partially filled k-space data set, a corresponding synthetic data set may still be a partially filled k-space data set. In some embodiments, the synthetic data generation unit 504 may generate the synthetic data sets simultaneously, or in sequence.

In 905, one or more combined data sets may be generated based on the synthetic data set(s) and the measured data set(s) or the pre-processed data set(s). The operation 905 may be performed by the combined data generation unit 506. The combined data set(s) may be determined in k-space or an intermediate space. A combined data set may relate to a corresponding synthetic data set and a corresponding measured (or pre-processed) data set. In some embodiments, if a synthetic data set includes a full k-space data set, the corresponding combined data set may still be a full k-space data set. In some embodiments, if a synthetic data set includes a partially filled k-space data set, the corresponding combined data set may still be a partially filled k-space data set. In some embodiments, a combined data set may be generated based on a linear or nonlinear combination of a corresponding synthetic data set and a corresponding measured (or pre-processed) data set. In some embodiments, the combination of a corresponding synthetic data set and a corresponding measured (or pre-processed) data set may be realized based on a relaxation iteration algorithm, or any other optimization algorithm.

Merely by way of example, for each synthetic data set and the corresponding measured (or pre-processed) data set, the combined data generation unit 506 may determine one or more weighting factors (or weights). The combined data generation unit 506 may determine a combined data set based on the weighting factor(s), a corresponding synthetic data set, and a corresponding measured (or pre-processed) data set. For example, the combined data generation unit 506 may determine a weighted sum of the corresponding synthetic data set and the corresponding measured (or pre-processed) data set based on the weighting factor(s). In some embodiments, the weighting factor(s) for different k-space data sets may be the same or different. In different iterations, the weighting factor(s) may remain the same or change. In some embodiments, the weighting factor(s) may be changed or adjusted based on the difference between the combined data sets generated in two or more consecutive iterations.

In 907, whether the combined data set(s) satisfy a condition may be determined. The operation 907 may be performed by the judgment unit 510. In some embodiments, the condition may relate to the difference between the combined data sets generated in two or more consecutive iterations. The judgment unit 510 may determine whether the difference is greater than a first threshold. In response to the determination that the difference is greater than the first threshold, the judgment unit 510 may determine to perform a next iteration, and the process may proceed to 909. In response to the determination that the difference is lower than or equal to the first threshold, the judgment unit 510 may determine to terminate the iteration(s), and the process may proceed to 911. In some embodiments, the condition may relate to an iteration count representing the number of iterations that have been performed. The judgment unit 510 may determine whether the iteration count is greater than a second threshold. In response to the determination that the iteration count is lower than the second threshold, the judgment unit 510 may determine to perform a next iteration, and the process may proceed to 909. In response to the determination that the iteration count is greater than or equal to the second threshold, the judgment unit 510 may determine to terminate the iteration(s), and the process may proceed to 911. In some embodiments, the first threshold and the second threshold may be predetermined according to practical scenarios. The first threshold and/or the second threshold may be part of default settings of the processing device 140, or may be set or adjusted by a user (e.g., a doctor).

In 909, the combined data set(s) may be designated as the measured data set(s) or the pre-processed data set(s). The operation 909 may be performed by the data updating unit 508. Before a next iteration is performed, the data updating unit 508 may designate the combined data set(s) as the measured (or pre-processed) data set(s). Then the process may proceed to 901, and a next iteration may be performed. In each iteration, the measured data set(s) or the pre-processed data set(s), the synthetic data set(s), and/or the combined data set(s) may be updated. Besides, the points in the convolution kernel(s) may be updated in different iterations. It should be noted that the convolution kernels generated in different iterations for a same channel may be the same or different. For example, the values of the elements of the convolution kernels may be different. As another example, the sizes of the convolution kernels may be the same or different. As a further example, the shapes of the convolution kernels may be the same or different.

In 911, the last generated combined data set(s) may be obtained. In some embodiments, the last generated combined data set(s) may be stored in the storage device 150 or used in further processing. In some embodiments, the last generated combined data set(s) may be obtained by the image reconstruction module 440 for reconstructing an image.

It should be noted that the above description of the process for generating the combined data set(s) is provided for the purposes of illustration, and is not intended to limit the scope of the present disclosure. For persons having ordinary skills in the art, multiple variations and modifications may be made under the teachings of the present disclosure. However, those variations and modifications do not depart from the scope of the present disclosure. In some embodiments, the operations 901 through 909 may be performed in k-space. In some embodiments, the operations 901 through 909 may be performed in an intermediate space.

FIGS. 10A-10D are schematic diagrams illustrating exemplary measured data sets, an exemplary convolution kernel, exemplary synthetic data sets, and exemplary combined data sets according to some embodiments of the present disclosure. The measured data sets for multiple channels may be shown in FIG. 10A. As shown in FIG. 10A, a first measured data set 1001 may be obtained from a first channel. A second measured data set 1002 may be obtained from a second channel. A third measured data set 1003 may be obtained from a third channel. As shown in FIG. 10A, the measured data sets may have first inconsistencies between multiple echoes. Each measured data set may include a plurality of data points. The first measured data set 1001 may be and/or include a full k-space data set or a partially filled k-space data set. The second measured data set 1002 may be and/or include a full k-space data set or a partially filled k-space data set. The third measured data set 1003 may be and/or include a full k-space data set or a partially filled k-space data set. As shown in FIG. 10A, the data points may misalign in the phase encoding direction, and accordingly, there may be inconsistencies between the even echoes and the odd echoes of the measured data sets. For example, the data point P1, the data point P2, and the data point P3 in the first measured data set 1001 in different echoes misalign in the phase encoding direction.

FIG. 10B shows an exemplary convolution kernel 1012 containing multiple channels. The convolution kernel 1012 may correspond to the measured data set 1002. The convolution kernel 1012 may be generated based on one or more measured (or corresponding pre-processed) data sets (e.g., all the measured (or corresponding pre-processed) data sets) and a kernel function (e.g., Equation (1)). For example, a target point (e.g., point T in the second measured data set 1002) may be fitted using data points within a supporting range (e.g., the supporting range 1005 indicated by a cuboid with a dashed frame in FIG. 10A) of the convolution kernel 1012 and a kernel function (e.g., Equation (1)). As shown in FIG. 10B, the solid points of the convolution kernel 1012 may indicate elements determined by data fitting based on corresponding data points of the first measured data set 1001, the second measured data set 1002, and the third measured data set 1003. In some embodiments, the hollow points of the convolution kernel 1012 may indicate there are no elements.

It should be noted that in some embodiments, a portion of the data points within the supporting range may be used in data fitting to determine one or more elements of a convolution kernel. For example, a second line 1007, a second line 1010, and a second line 1014 may not be used in data fitting to determine the elements (illustrated as the solid points in FIG. 10B) of the convolution kernel 1012. As shown in FIG. 10A, a first set of data of the first measured data set 1001, a second set of data of the second measured data set 1002, and a third set of data of the third measured data set 1003 may be used in data fitting. The first set of data may include the three data points in the first line 1006 within the supporting range 1005 and the three data points in the third line 1008 within the supporting range 1005). The second set of data may include the three data points in the first line 1009 within the supporting range 1005 and the three data points in the third line 1011 within the supporting range 1005). The third set of data may include the three data points in the first line 1013 within the supporting range 1005 and the three data points in the third line 1015 within the supporting range 1005). In some embodiments, the data points in the second line 1007 of the first measured data set 1001 within the supporting range 1005, the data points in the second line 1010 of the second measured data set 1002 within the supporting range 1005, and the data points in the second line 1014 of the second measured data set 1003 within the supporting range 1005 may not be used in data fitting. In some embodiments, if the data points in the second line 1007 of the first measured data set 1001 within the supporting range 1005, the data points in the second line 1010 of the second measured data set 1002 within the supporting range 1005, and the data points in the second line 1014 of the second measured data set 1003 within the supporting range 1005 are used in data fitting, then corresponding elements may be added in the convolution kernel 1012 at the hollow points, and thus, the hollow points may be converted to solid points.

Similarly, one or more target points in a measured (or corresponding pre-processed) data set (e.g., the measured data set 1002) may be fitted using data points within the supporting range by traversing the measured (or corresponding pre-processed) data sets (e.g., all the measured (or corresponding pre-processed) data sets). The data fitting may be performed based on a least square fitting technique, and one or more weights may be determined. Thus, the convolution kernel 1012 may be determined based on the weights generated by the data fitting. Similarly, a first convolution kernel (not shown in FIG. 10B) corresponding to the measured data set 1001 (or the corresponding pre-processed data set) and/or a third convolution kernel (not shown in FIG. 10B) corresponding to the measured data set 1003 (or the corresponding pre-processed data set) may be determined.

The convolution kernel 1012 shown in FIG. 10B having a 2×3 (the channel dimension is omitted) size or 3×3×3 (or 3×3 for simplicity) is merely an example, and the convolution kernel 1012 may have other sizes and/or shapes. For example, the convolution kernel may have a 3×4×3 (or 3×4 for simplicity) size, 4×2×3 (or 4×2 for simplicity) size, etc. In some embodiments, convolution kernels for different channels may have different sizes. For example, a first convolution kernel may have a 3×3×3 (or 3×3 for simplicity) size, a second convolution kernel may have a 5×7×3 (or 5×7 for simplicity) size, and a third convolution kernel may have a 7×3×3 (or 7×3 for simplicity) size.

As shown in FIG. 10C, a second synthetic data set 1022 may be generated based on a convolution of the measured (or pre-processed) data sets (e.g., the first measured data set 1001, the second measured data set 1002, and the third measured data set 1003) and the convolution kernel 1012. In each convolution, a data point of the second synthetic data set 1022 (e.g., point B shown in FIG. 10C) corresponding to the center of the convolution kernel 1012 (e.g., point A shown in FIG. 10B) may be determined based on a weighted sum of all the elements of the convolution kernel 1012 (e.g., the data points illustrated as solid dots in FIG. 10B) and the corresponding elements of the first measured data set 1001, the second measured data set 1002, and the third measured data set 1003 (e.g., the elements within the supporting range 1005 excluding the second line 1007, the second line 1010, and the second line 1014). All the data points of the second synthetic data set 1022 may be determined by traversing the convolution kernel 1012 in the first measured data set 1001, the second measured data set 1002, and the third measured data set 1003. As the convolution kernel 1012 traverses the measured (or pre-processed) data sets, the synthetic data set 1022 may be determined by summing up all the data points in the supporting range using weights provided by the convolution kernel 1012. Similarly, the first synthetic data set 1021 and the third synthetic data set 1023 may be determined based on a convolution of the measured (or pre-processed) data sets (e.g., the first measured data set 1001, the second measured data set 1002, and the third measured data set 1003) and the corresponding convolution kernel (e.g., the first convolution kernel and the third convolution kernel not shown in FIG. 10B). As shown in FIG. 10C, the synthetic data set(s) may have second inconsistencies between multiple echoes. The second inconsistencies may be different from the first inconsistencies.

As shown in FIG. 10D, a first combined data set 1031 may be generated based on a combination of the first measured data set 1001 (or corresponding pre-processed data set) and the first synthetic data set 1021. A second combined data set 1032 may be generated based on a combination of the second measured data set 1002 (or corresponding pre-processed data set) and the second synthetic data set 1022. A third combined data set 1033 may be generated based on a combination of the third measured data set 1003 (or corresponding pre-processed data set) and the third synthetic data set 1023. As shown in FIG. 10D, the inconsistencies in the combined data set(s) may be substantially eliminated in the combined data sets obtained by combining the measured data set(s) and the synthetic data set(s). It should be noted that the measured data set(s) (or the synthetic data set(s), or the combined data set(s)) are merely examples, and are not intended to limit the scope of the present disclosure. For example, the number of data sets (or channels) may be any integer larger than 1. As another example, the odd-even line inconsistencies may have other forms, e.g., overall phase differences and shifts along the phase encoding direction and/or the readout direction, etc. As still another example, the measured data sets shown in FIG. 10A may be replaced with pre-processed data sets, and the combined data sets may be similarly generated.

FIGS. 11A and 11B are exemplary images processed by 1D correction with different brightness. Before reconstructing the images, the measured data set(s) were corrected by performing a one-dimensional correction according to process 800 of FIG. 8. The image in FIG. 11B has a higher brightness than FIG. 11A. As shown in FIG. 11B, Nyquist ghost artifact can be seen in the image.

FIGS. 11C and 11D are exemplary images processed by 2D correction with different brightness. Before image reconstruction, the measured data set(s) were corrected by performing a 1D correction according to process 800 of FIG. 8 and a 2D correction according to process 900 of FIG. 9. The image in FIG. 11D has higher brightness than FIG. 11C. As shown in FIG. 11D, the image includes reduced Nyquist ghost artifact or no Nyquist ghost artifact is clearly visible.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "unit," "module," or "system." Furthermore, aspects of the present disclosure may take the form of a computer program product embodied in one or more computer readable media having computer readable program code embodied thereon.

A non-transitory computer readable signal medium may include a propagated data signal with computer readable program code embodied therein, for example, in baseband or as part of a carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C#, VB. NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various inventive embodiments. This method of disclosure, however, is not to be interpreted as reflecting an intention that the claimed subject matter requires more features than are expressly recited in each claim. Rather, inventive embodiments lie in less than all features of a single foregoing disclosed embodiment.

In some embodiments, the numbers expressing quantities, properties, and so forth, used to describe and claim certain embodiments of the application are to be understood as being modified in some instances by the term "about," "approximate," or "substantially." For example, "about," "approximate," or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

What is claimed is:

1. A method implemented on a computing device having at least one processor, at least one computer-readable storage medium, and a communication port connected to an imaging device, the imaging device including a plurality of radiofrequency (RF) coils for receiving a plurality of channels of magnetic resonance (MR) signals, the method comprising:
 a) obtaining a plurality of measured data sets generated by scanning a subject using the imaging device, each measured data set corresponding to a channel of MR signal received by an RF coil;
 b) determining, based on the plurality of measured data sets, in a data space, a plurality of convolution kernels, each convolution kernel relating to all of the plurality of measured data sets, each convolution kernel corresponding to a channel of MR signal received by an RF coil;
 c) generating, based on the plurality of convolution kernels and the plurality of measured data sets, in the data space, a plurality of synthetic data sets, wherein each synthetic data set is generated based on one or more of the plurality of measured data sets and a corresponding convolution kernel of the plurality of convolution kernels, and wherein each synthetic data set and the corresponding convolution kernel correspond to a same channel;
 d) generating, based on the plurality of synthetic data sets and the plurality of measured data sets, in the data space, a plurality of combined data sets, each combined data set relating to one of the plurality of synthetic data sets and a corresponding measured data set of the plurality of measured data sets; and
 e) reconstructing, based on the plurality of combined data sets, an image using an inverse Fourier transform.

2. The method of claim 1, wherein the plurality of measured data sets are generated by echo planar imaging (EPI) using the imaging device.

3. The method of claim 1, wherein the plurality of measured data sets are pre-processed by performing a preliminary correction for the plurality of measured data sets.

4. The method of claim 1, further comprising:
 performing a plurality of iterations, and in each current iteration,
  designating the plurality of combined data sets generated in a previous iteration as the plurality of measured data sets;
  repeating b)-d) to update the plurality of combined data sets; and
  determining whether the plurality of updated combined data sets generated in the current iteration satisfy a termination criterion.

5. The method of claim 4, wherein the termination criterion relates to a difference between the plurality of combined data sets generated in the previous iteration and the plurality of updated combined data sets generated in the current iteration.

6. The method of claim 4, wherein at least two convolution kernels for a same channel generated in different iterations are different.

7. The method of claim 1, wherein each measured data set of the plurality of measured data sets includes a full k-space data set.

8. The method of claim 7, wherein the reconstructing an image comprises:
 processing the plurality of combined data sets with an inverse Fourier transform to generate the image.

9. The method of claim 1, wherein at least one measured data set of the plurality of measured data sets includes a partially filled k-space data set.

10. The method of claim 9, wherein the reconstructing an image comprises:
 for each measured data set including a partially filled k-space data set, filling, based on at least a portion of the plurality of combined data sets, a corresponding combined data set to reconstruct a full k-space data set; and
 processing a plurality of full k-space data sets corresponding to the plurality of combined data sets with an inverse Fourier transform to generate the image.

11. The method of claim 1, wherein the data space is k-space.

12. The method of claim 1, wherein the data space is an intermediate space between k-space and an image space, the method further comprising:
 determining the intermediate space by processing k-space with a one-dimensional (1D) inverse Fourier transform.

13. The method of claim 1, wherein at east two convolution kernels of the plurality of convolution kernels are different.

14. The method of claim 1, wherein the generating a plurality of combined data sets comprises;
 determining, based on a plurality of weighting factors, a weighted sum of the plurality of synthetic data sets and the plurality of measured data sets to obtain the plurality of combined data sets, wherein each combined data set is determined based on a portion of the plurality of weighting factors, one of the plurality of synthetic data sets, and a corresponding measured data set of the plurality of measured data sets.

15. A magnetic resonance imaging (MRI) method, comprising:
 generating a plurality of magnetic resonance (MR) signals by scanning a subject using an imaging device;
 receiving the plurality of MR signals using a plurality of radiofrequency (RF) coils of the imaging device;
 obtaining a plurality of measured k-space data sets by entering the MR signals into k-space, each measured k-space data set corresponding to one of the plurality of RF coils;
 performing one or more corrections for the plurality of measured k-space data sets to obtain a plurality of corrected k-space data sets; and
 reconstructing, based on the plurality of corrected k-space data sets, an image related to the subject using an inverse Fourier transform, wherein the one or more corrections comprise:
  determining, based on the plurality of measured k-space data sets, a plurality of convolution kernels;
  generating, based on the plurality of convolution kernels and the plurality of measured k-space data sets, a plurality of synthetic k-space data sets; and
  generating, based on the plurality of synthetic k-space data sets and the plurality of measured k-space data sets, the plurality of corrected k-space data sets.

16. The method of claim 15, further comprising:
before determining the plurality of convolution kernels, performing a linear or non-linear correction for the plurality of measured k-space data sets.

17. The method of claim 15, wherein the determining a plurality of convolution kernels comprises:
processing the plurality of measured k-space data sets with one-dimensional (1D) inverse Fourier transform to obtain an intermediate image; and
determining, based on the intermediate image, the plurality of convolution kernels.

18. A system, comprising:
at least one storage medium storing a set of instructions;
at least one processor in communication with the at least one storage medium; and
a communication port connected to an imaging device, the imaging device including a plurality of radiofrequency (RF) coils for receiving a plurality of channels of magnetic resonance (MR) signals; wherein when executing the set of instructions, the at least one processor is configured to cause the system to:
a) obtain a plurality of measured data sets generated by scanning a subject using the imaging device, each measured data set corresponding to a channel of MR signal received by an RF coil;
b) determine, based on the plurality of measured data sets, in a data space, a plurality of convolution kernels, each convolution kernel relating to all of the plurality of measured data sets, each convolution kernel corresponding to a channel of MR signal received by an RF coil;
c) generate, based on the plurality of convolution kernels and the plurality of measured data sets, in the data space, a plurality of synthetic data sets, wherein each synthetic data set is generated based on one or more of the plurality of measured data sets and a convolution kernel of the plurality of convolution kernels, and wherein each synthetic data set and the convolution kernel correspond to a same channel;
d) generate, based on the plurality of synthetic data sets and the plurality of measured data sets, in the data space, a plurality of combined data sets, each combined data set relating to one of the plurality of synthetic data sets and a corresponding measured data set of the plurality of measured data sets; and
e) reconstruct, based on the plurality of combined data sets, an image using an inverse Fourier transform.

19. The system of claim 18, wherein at least one measured data set of the plurality of measured data sets includes a partially filled k-space data set.

20. The system of claim 18, wherein the data space is k-space or an intermediate space between k-space and an image space.

* * * * *